US010573645B2

(12) United States Patent
Kim et al.

(10) Patent No.: US 10,573,645 B2
(45) Date of Patent: Feb. 25, 2020

(54) INTEGRATED SEMICONDUCTOR DEVICE AND METHOD FOR MANUFACTURING THE SAME

(71) Applicant: Magnachip Semiconductor, Ltd., Cheongju-si (KR)

(72) Inventors: Young Bae Kim, Cheongju-si (KR); Kwang Il Kim, Cheongju-si (KR); Jun Hyun Kim, Gumi-si (KR); In Sik Jung, Gumi-si (KR); Jae Hyung Jang, Daejeon (KR); Jin Yeong Son, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 16/140,821

(22) Filed: Sep. 25, 2018

(65) Prior Publication Data
US 2019/0035783 A1 Jan. 31, 2019

Related U.S. Application Data

(63) Continuation of application No. 15/419,144, filed on Jan. 30, 2017, now Pat. No. 10,115,720.

(30) Foreign Application Priority Data

Apr. 15, 2016 (KR) .................. 10-2016-0046171
Jul. 25, 2016 (KR) .................. 10-2016-0094064

(51) Int. Cl.
*H01L 29/78* (2006.01)
*H01L 27/088* (2006.01)
(Continued)

(52) U.S. Cl.
CPC ...... *H01L 27/088* (2013.01); *H01L 21/28247* (2013.01); *H01L 21/761* (2013.01); *H01L 21/764* (2013.01); *H01L 21/823418* (2013.01); *H01L 21/823462* (2013.01); *H01L 29/0847* (2013.01); *H01L 29/0878* (2013.01); *H01L 29/42368* (2013.01); *H01L 29/66659* (2013.01); *H01L 29/66689* (2013.01); *H01L 29/7816* (2013.01); *H01L 29/7835* (2013.01);
(Continued)

(58) Field of Classification Search
CPC .......... H01L 29/7835; H01L 29/42368; H01L 29/7816; H01L 29/0847; H01L 29/761; H01L 21/761; H01L 21/823418; H01L 29/66659; H01L 21/28247; H01L 21/823462
See application file for complete search history.

(56) References Cited

U.S. PATENT DOCUMENTS 7,892,960 B2 2/2011 Park
2001/0046748 A1 11/2001 Rodder
(Continued)

*Primary Examiner* — Caridad Everhart
(74) *Attorney, Agent, or Firm* — NSIP Law

(57) ABSTRACT

A semiconductor device includes a substrate including a first region and a second region, a first transistor and a second transistor formed in the first region and second region, respectively, wherein the first transistor includes a thick gate insulating layer and a thin buffer insulating layer formed in the substrate, a first gate electrode formed on the thick gate insulating layer, a first spacer formed on the thin buffer insulating layer, and a source region and a drain region formed in the substrate.

18 Claims, 27 Drawing Sheets

(51) Int. Cl.

| | |
|---|---|
| *H01L 29/08* | (2006.01) |
| *H01L 21/8234* | (2006.01) |
| *H01L 29/66* | (2006.01) |
| *H01L 29/423* | (2006.01) |
| *H01L 21/28* | (2006.01) |
| *H01L 21/761* | (2006.01) |
| *H01L 21/764* | (2006.01) |
| *H01L 29/49* | (2006.01) |

(52) U.S. Cl.
CPC ........ *H01L 29/4933* (2013.01); *H01L 29/665* (2013.01); *H01L 29/6656* (2013.01)

(56) References Cited

U.S. PATENT DOCUMENTS

| | | |
|---|---|---|
| 2002/0055233 A1* | 5/2002 | Mitros .............. H01L 29/66659 438/299 |
| 2004/0084674 A1 | 5/2004 | Mathew et al. |
| 2004/0173854 A1 | 9/2004 | Kwon et al. |
| 2005/0003596 A1 | 1/2005 | Chin |
| 2010/0213517 A1 | 8/2010 | Sonsky et al. |
| 2010/0244106 A1* | 9/2010 | Parker ............... H01L 21/26513 257/288 |
| 2014/0145265 A1 | 5/2014 | Shrivastava et al. |
| 2015/0093870 A1 | 4/2015 | Wu et al. |
| 2015/0349065 A1 | 12/2015 | Li et al. |

* cited by examiner

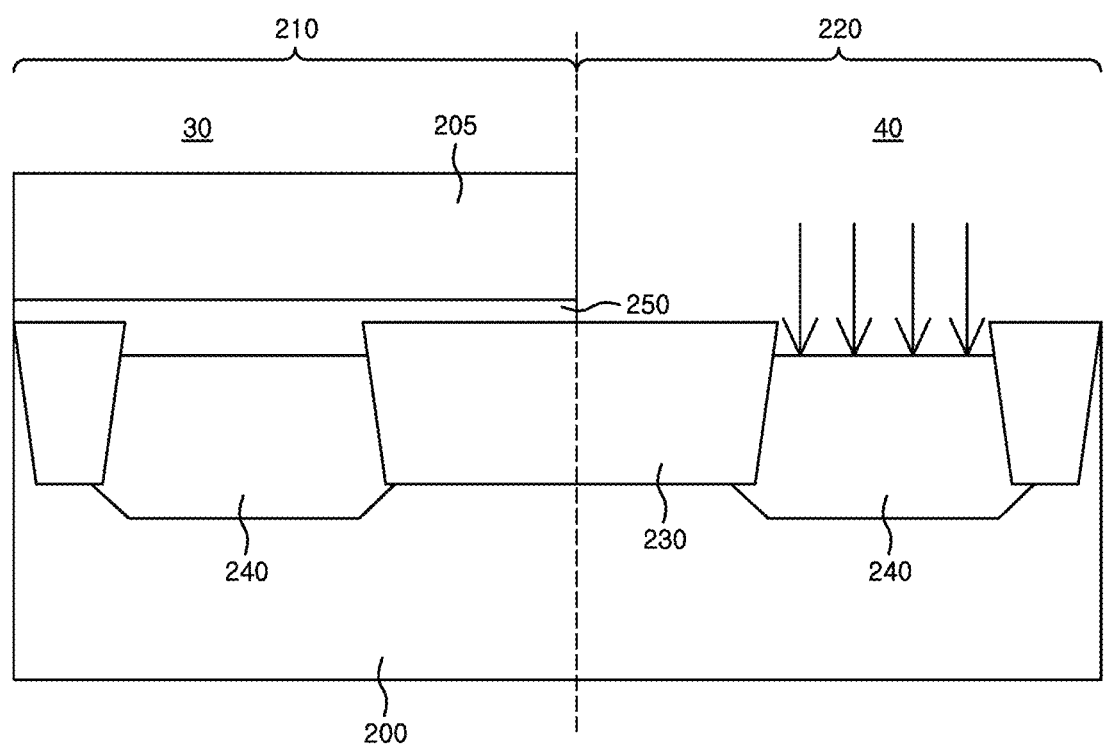

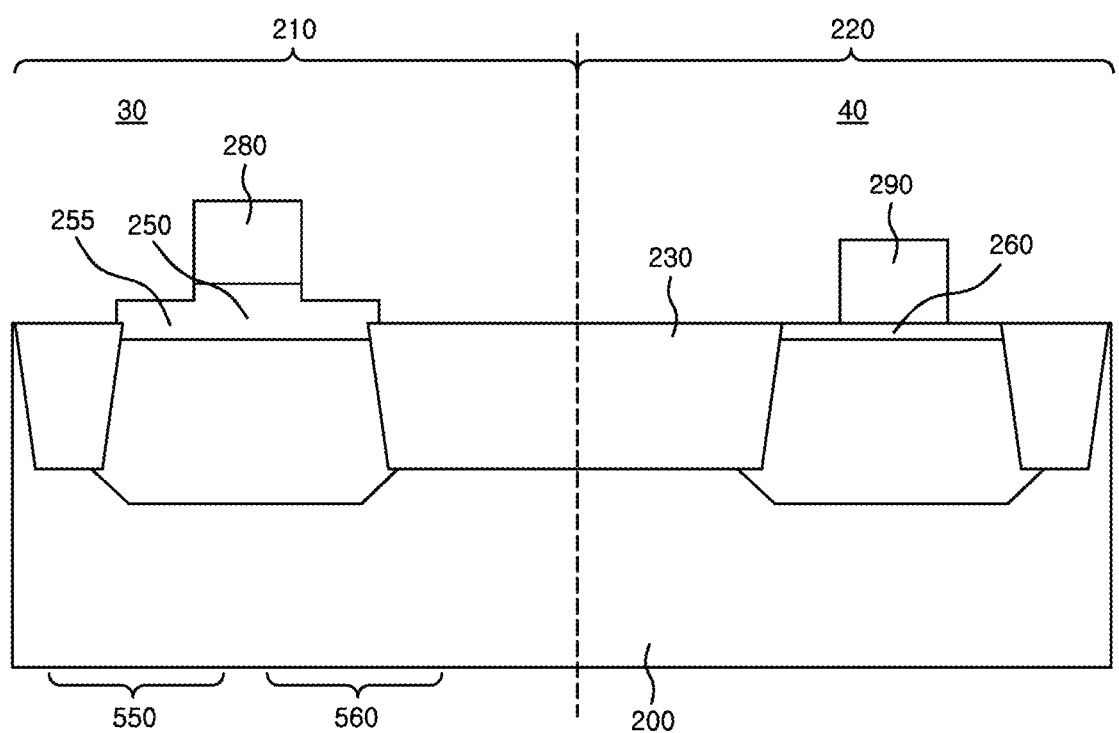

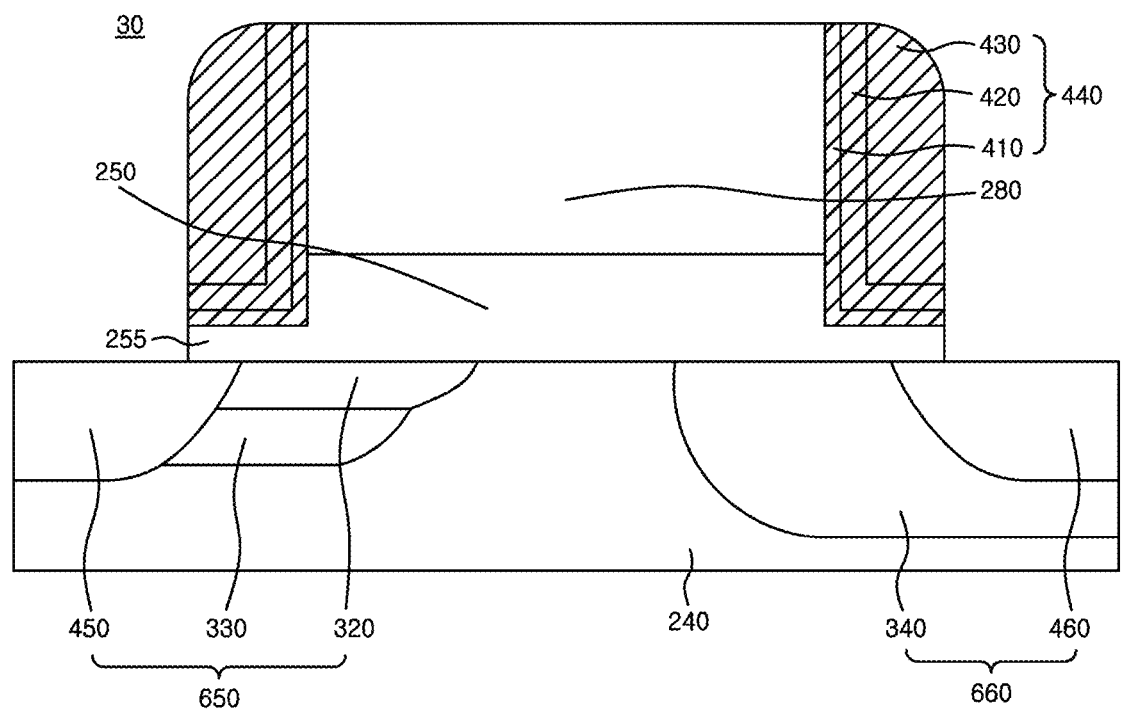

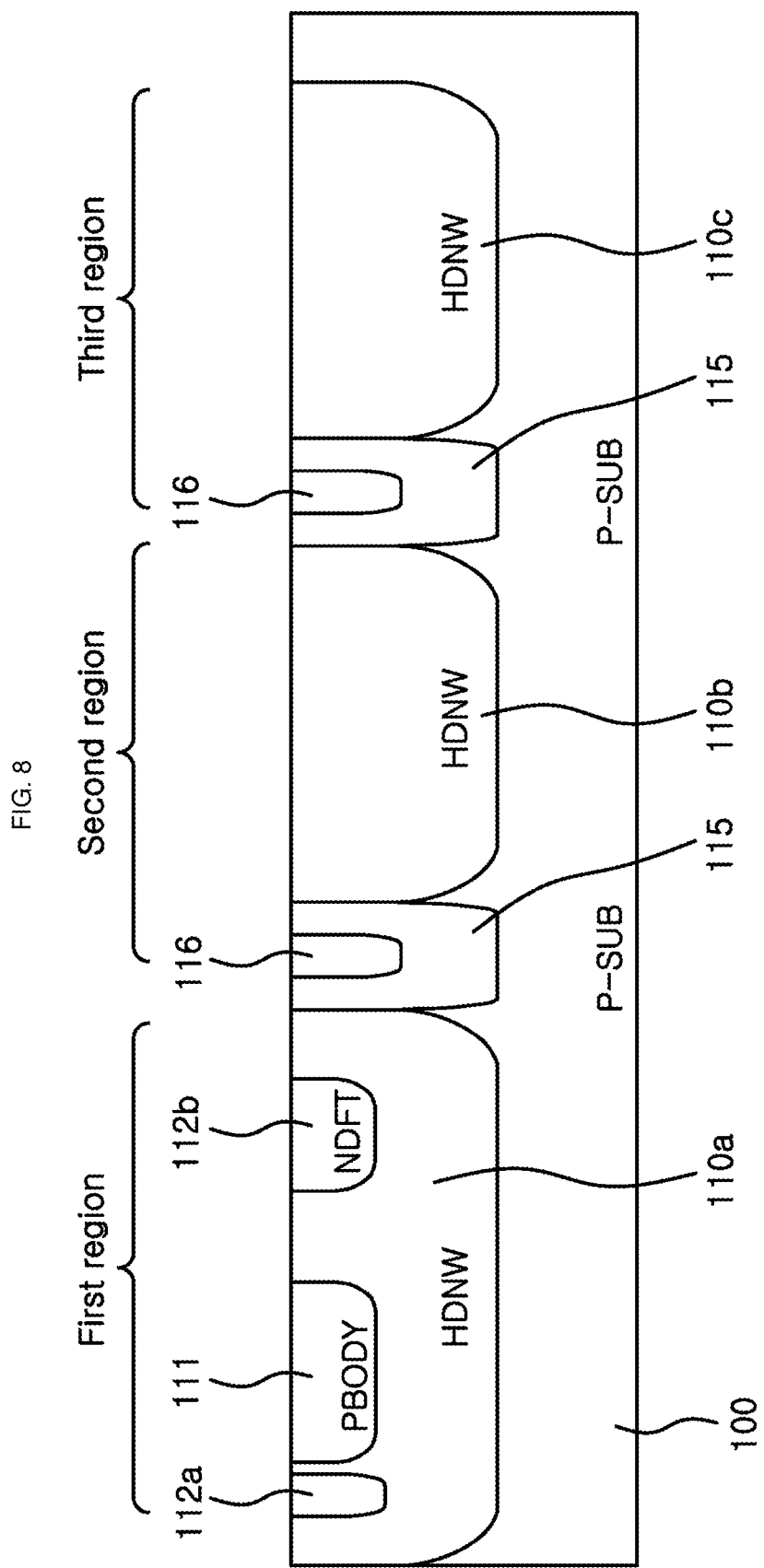

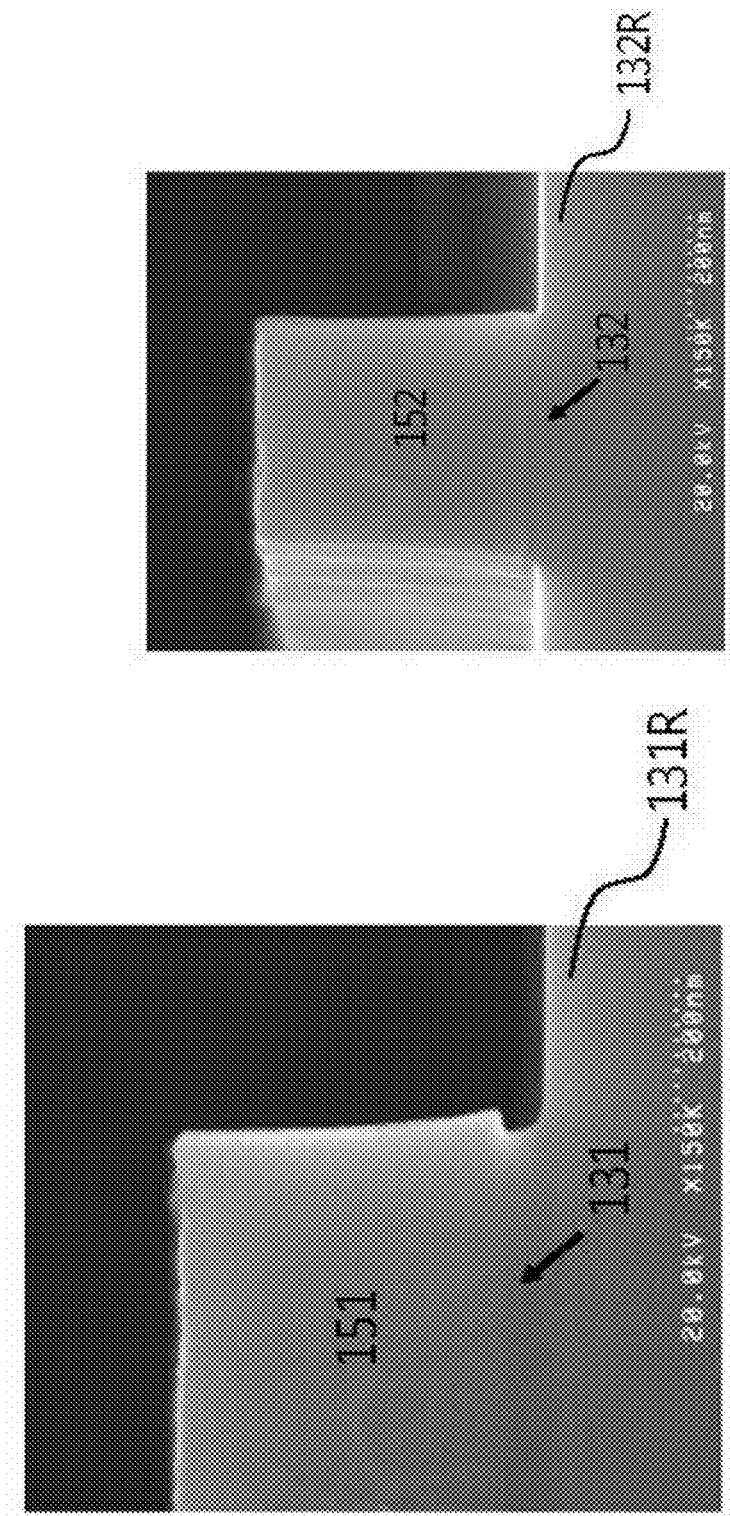

INTEGRATED SEMICONDUCTOR DEVICE AND METHOD FOR MANUFACTURING THE SAME

CROSS-REFERENCE TO RELATED APPLICATIONS

This application is a continuation of U.S. application Ser. No. 15/419,144 filed on Jan. 30, 2017, now U.S. Pat. No. 10,115,720, issued on Oct. 30, 2018, which claims the benefit under 35 USC 119(a) of Korean Patent Application No. 10-2016-0094064 filed on Jul. 25, 2016 and No. 10-2016-0046171 filed on Apr. 15, 2016 in the Korean Intellectual Property Office, the entire disclosures of which are incorporated herein by reference for all purposes.

BACKGROUND

1. Field

The following description relates to an integrated semiconductor device with a hybrid transistor, a high voltage transistor, and a low voltage transistor. The following description also relates to a method for manufacturing such an integrated semiconductor device.

2. Description of Related Art

An integrated semiconductor device with a hybrid transistor, a high voltage transistor and a low voltage transistor is quite useful for several device functions. For example, the high and low transistors are generally used for analog and mixed-signal applications. A hybrid transistor is preferred for operation as an amplifying or switching device. A lateral diffusion MOS (LDMOS), a vertical diffusion MOS (VDMOS), and a trench VDMOS (Trench VDMOS) are examples of asymmetrical power metal-oxide-semiconductor field-effect transistors (MOSFETs). The structures of a source and a drain formed in the hybrid transistor are different from each other. Because the hybrid transistor has a rapid speed of operation compared to a high voltage transistor of the same size, the hybrid transistor is often used as a switching device. The switching device performs the role of controlling electric power such as by switching to power standby status, switching to turn a display off, and switching to a save mode when a battery level is at a below average level.

The hybrid transistor is made to have an integrated structure by using the same mask used for manufacturing of an LV/HV device. When a separate mask is used for a hybrid transistor, inefficiency in terms of overall costs happens because of increase in manufacturing costs. However, when the hybrid transistor is manufactured by an approach based on the integration with a HV/LV device, the low on-resistance (Low Ron) and low leakage current characteristics required for a hybrid transistor deteriorate.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A semiconductor device includes a substrate including a first region and a second region, and a first transistor and a second transistor formed in the first region and second region, respectively, wherein the first transistor includes a thick gate insulating layer and a thin buffer insulating layer formed in the substrate, a first gate electrode formed on the thick gate insulating layer, a first spacer formed on the thin buffer insulating layer, and a source region and a drain region formed in the substrate.

The thickness of the thin buffer insulating layer may be 10 to 50% of that of the thick gate insulating layer.

The semiconductor device may further include a first conductivity-type body region surrounding the source region, a second conductivity-type drift region surrounding the drain region, and a thick isolation layer formed between the gate electrode and the drain region.

The body region may be P-type and the drift region may be N-type.

The source region may be asymmetric to the drain region, and the source region may include a shallow LDD region, and a highly doped source region, and the drain structure may include a highly doped drain region, and a deep LDD region surrounding the highly doped drain region.

The source structure may further include a deep LDD region surrounding the highly doped source region.

The thick gate insulating layer may include a stacked layer of CVD oxide and thermal oxide.

In another general aspect, a manufacturing method for a semiconductor device includes providing a substrate including a first region and a second region, forming a thick gate insulating layer on the first region, forming a gate electrode on the thick gate insulating layer, performing a wet etching process on the thick gate insulating layer disposed outside the gate electrode such that a thin buffer insulating layer is formed adjacent to the thick gate insulating layer, located outside of the gate electrode, forming a LDD region in the substrate, and forming a first spacer on the thin buffer insulating layer.

The thickness of the thin buffer insulating layer may be 10 to 50% of the thickness of the thick gate insulating layer.

Providing the substrate may further include forming a first deep well region of a first conductivity type and a second deep well region of the first conductivity type in the substrate, and forming a body region of a second conductivity type and a drift region of the first conductivity type on the first deep well region.

The manufacturing method for a semiconductor device may further include forming a source region of the first conductivity type on the body region, and forming a drain region of the first conductivity type on the drift region.

The wet etching process may use a diluted hydrofluoric acid (HF) solution.

The manufacturing method for a semiconductor device may further include performing a sidewall oxidation before the formation of the LDD region.

In another general aspect, a manufacturing method of a semiconductor device includes forming a thick gate insulating layer with a first thickness on a substrate, depositing conductive material on the thick gate insulating layer, forming a gate electrode by patterning the conductive material, forming a thin gate insulating layer with a second thickness by etching exposed gate insulating layer on both sides of the gate electrode, forming a sidewall oxide film by oxidizing a sidewall of the gate electrode, exposing a first region of the gate electrode that is close to a source zone and the thin gate insulating layer by using a first mask pattern, performing a first ion injection on the source zone through the gate electrode and the thin gate insulating layer, exposing a second region that is close to a drain zone of the gate electrode and the thin gate insulating layer by using a second mask pattern, performing a second ion injection on the drain zone through the gate electrode and thin gate insulating layer, forming a spacer on the thin gate insulating layer, and performing a third ion injection on a side of the spacer.

In another general aspect, a semiconductor device includes a semiconductor substrate including a first region, a second region, and a third region, a well region with a second conductivity type separately formed on the first, second, and third regions, a first, a second, and a third gate insulating layer respectively formed on the first, second, and third regions, a first, a second, and a third gate electrode respectively formed on the first, second, and third regions, a first, a second, and a third source/drain structure respectively formed on the first, second, third regions, a first, a second, and a third spacer respectively formed on the sides of the first, second, third gate electrodes, a first, a second, and a third remnant gate insulating layer respectively formed below the first, second, and third spacers, wherein the first source structure of the first region is symmetric to the first drain structure, the second source structure of the second region is asymmetric to the second drain structure, the third source structure of the third region is symmetric to the third drain structure, the second source structure includes a shallow LDD region and a source region, the second drain structure includes a drain region and a second deep LDD region surrounding the drain region, and the thickness of the remnant gate insulating layer of the second region is 10 to 40% of the thickness of the second gate insulating layer.

Other features and aspects will be apparent from the following detailed description, the drawings, and the claims.

BRIEF DESCRIPTION OF THE DRAWINGS

FIGS. 2A-2C are cross-sectionals view illustrating a method of manufacturing a hybrid transistor and a low voltage transistor according to an example.

FIGS. 4A-4C are drawings illustrating a process of forming a spacer and source/drain region of a hybrid transistor.

FIG. 8 is a diagram that illustrates forming a voltage region and a deep well region.

FIGS. 14A and 14B are diagrams that illustrate the image of Scanning Electron Microscope (SEM) of LDMOS transistor and low voltage transistor after a pre-cleaning process and an additional etching process.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
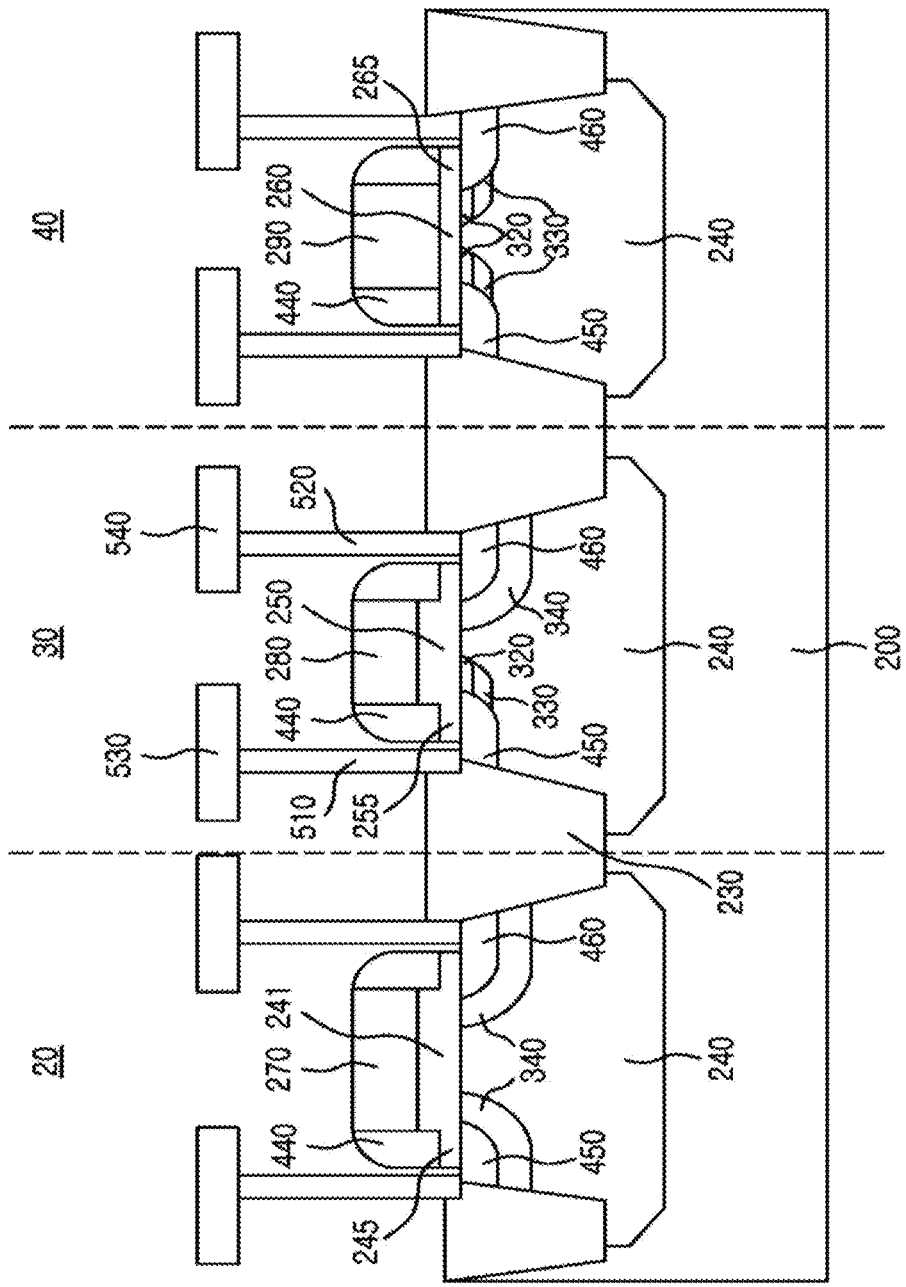
FIG. 1 is a cross-sectional view illustrating a high voltage transistor, a hybrid transistor, and a low voltage transistor according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Semiconductor devices and methods for manufacturing the same according to an example of the present disclosure are able to reach targets of RDSon, Ioff, Vt, BV (breakdown voltage) of a hybrid transistor even in a short channel environment.

Thus, the present examples are directed to providing a semiconductor device wherein RDSon (ON state Drain-to-Source Resistance), leakage current, and Breakdown Voltage (BV) characteristics of a hybrid transistor are not deteriorated when a HV/LV device is combined with the hybrid transistor. The present examples are also directed to a method for manufacturing such a semiconductor device.

FIG. 1 is a cross-sectional view illustrating a high voltage transistor, a hybrid transistor, and a low voltage transistor according to an example.

The example of FIG. 1 is a cross-sectional view illustrating a high voltage transistor 20, a hybrid transistor 30, and a low voltage transistor 40 that are respectively formed on a first, a second, and a third region. The semiconductor device according to an example includes a semiconductor substrate 200 including the first, the second, and the third region, a well region with the second conductivity type 240 separately formed on the first, second, and third region, a first, a second, and a third gate insulating layer 241, 250, 260 respectively formed on the first, the second, and the third region, a first, a second, and a third gate electrode 270, 280, 290 respectively formed on the first, the second, and the third region; a first, a second, and a third source/drain structure respectively formed on the first, the second, and the third region, a first, a second, and a third spacer 440 respectively formed on the sides of the first, the second, and the third gate electrode 270, 280, 290, and a first, a second, and a third buffer insulating layer 245, 255, 265 formed under the sidewall spacers 440.

The first source structure of the first region is symmetric to the first drain structure, and the third source structure of the third region is symmetric to the third drain structure. However, the second source structure of the second region is asymmetric to the second drain structure. The second source structure includes a shallow LDD region 320 and a highly doped source region 450, and the second drain structure includes a highly doped drain region 460 and a second deep LDD region 340 enclosing the highly doped drain region. In the example of FIG. 1, the thickness of the buffer insulating layer 255 of the second region 30 is 10% to 40% of the thickness of the second gate insulating layer 250.

In the example of FIG. 1, the thicknesses of the first and the second gate insulating layers 241, 250 are identical to each other. These thicknesses are thicker than the thickness of the third gate insulating layer 260. The hybrid transistor formed on the second region 30 is a semiconductor device used as a switching device. The second gate insulating layer 250 is a semiconductor device formed by combining a chemical vapor deposition (CVD) oxide film and a thermal oxide film. Subsequently, the first conductivity type refers to N-type conductivity and the second conductivity type refers to P-type conductivity.

In the example of FIG. 1, a P-type well region 240 is formed on a semiconductor substrate 200. In this example, a high voltage transistor 20, a hybrid transistor 30 and a low voltage transistor 40 are formed on the P-type well region 240. A trench isolation region 230 is formed between the high voltage transistor 20, the hybrid transistor 30, and the low voltage (LV) transistor 40.

Several operations are involved in manufacturing the semiconductor device shown in FIG. 1.

First, in the high voltage transistor 20, a source region 450 and a drain region 460 are formed on the P-type well region 240. DEEP LDD regions 340 enclose the source region 450 and a drain region 460. An N-type channel region is formed between low-concentration DEPP LDD regions 340. The source structure and the drain structure are formed to be symmetrical to each other in the high voltage transistor 20.

Meanwhile, the source structure and the drain structure are formed to be asymmetrical to each other in a hybrid transistor 30. In the source structure, a source region 450, a shallow LDD region 320, and a P-type Halo or pocket region 330 are formed. In the example of FIG. 1, the Halo or pocket region 340 takes on the role of preventing a punch-through of the source-drain zone. However, in the drain structure, a drain region 460 and an N-type low-concentration deep LDD region 340 are formed. In the example of FIG. 1, the low-concentration deep LDD region 340 encompasses the drain region 460.

In the low voltage transistor (LV) 40, the source structure and the drain structure are formed to be symmetrical to each other. A source region 450, an N-type shallow LDD region 320, and a P-type Halo region 330 are formed in the source structure of the low voltage transistor 40. In the example of FIG. 1, the depth and doping concentration of the shallow LDD region 320 and the deep LDD region 340 are different from each other. A drain region 460, a shallow region 320, and a P-type Halo region 330 are formed in the drain structure. By contrast to the high voltage transistor 20, a low-concentration deep LDD region 340 does not exist in the LV transistor. Because the length of the gate of the low voltage transistor 40 is very short, being below 0.18 um, it is difficult to secure a channel length when a DEEP LDD region is formed in the LV transistor.

In the example of FIG. 1, a high voltage gate insulating layer 241, a hybrid gate insulating layer 250, and a low voltage gate insulating layer 260 are formed on the substrate. Additionally, an HV gate electrode 270, a hybrid gate electrode 280, and an LV gate electrode 280 are formed on each gate insulating layer. Through performing a gate fabrication process and an additional etching process, the first insulating layer 245, the second buffer insulating layer 255, and the third insulating layer 265 are caused to remain under spacers 440. In such an example, contact plugs 510, 520 are linked to the source/drain/gate electrodes and metal lines 530, 540 are formed. Furthermore, a predetermined voltage such as the power voltage or ground voltage may be applied to the contact plugs 510, 520.

FIG. 2 is a cross-sectional view illustrating a method of manufacturing a hybrid transistor and a low voltage transistor according to an example. The method for manufacturing such a high voltage transistor is omitted as the method for manufacturing it is similar to the method for manufacturing a hybrid transistor except for the structural differences discussed above with respect to FIG. 1.

First, as illustrated in FIG. 2A, in the semiconductor device there are, initially, a first region 210 for the formation of a hybrid transistor 30 and a second region 220 for the formation of a low voltage transistor 40. A trench isolation region 230 is formed on the boundary of the region where the hybrid transistor 30 and the low voltage transistor 40 are formed. A thick gate insulating layer 250 is formed on the substrate 200 in a P-type well region 240. The thick gate insulating layer 250 is formed by the Chemical Vapor Deposition (CVD) process. The CVD oxide film is formed at a temperature between 500-700° C. and at a low pressure below the air pressure. If the thick gate insulating layer 250 is formed as a thermal oxide film by a thermal oxidation method with the thickness being between 10-50 nm, there is a high possibility that a thinner gate oxide film is formed at the trench corner rather than being formed at the thicker gate oxide film in the center region. In that example, there is leakage current caused by the thinner gate oxide film in the trench top corner.

By contrast, as the CVD oxide film has an advantage of having a controlled thickness, a gate insulating layer that requires a thickness beyond 10 nm preferably is formed by using a CVD oxide film. Thus, a thick gate insulating layer is able to be formed on the upper portions of the first region 210 and the second region 220 at the same time. The thickness of such a thick gate insulating layer may be between 10-50 nm.

Next, a PR mask pattern 205 is formed on the first region 210 by coating and patterning photo resist on the thick gate insulating layer 25. In such an example, a thick gate insulating layer is exposed in the second region 220. Furthermore, a substrate 200 is exposed by selectively removing the thick gate insulating layer formed on the second region 220 through a wet etching process. Then, a PR mask pattern 205 is removed.

Figure 2B:
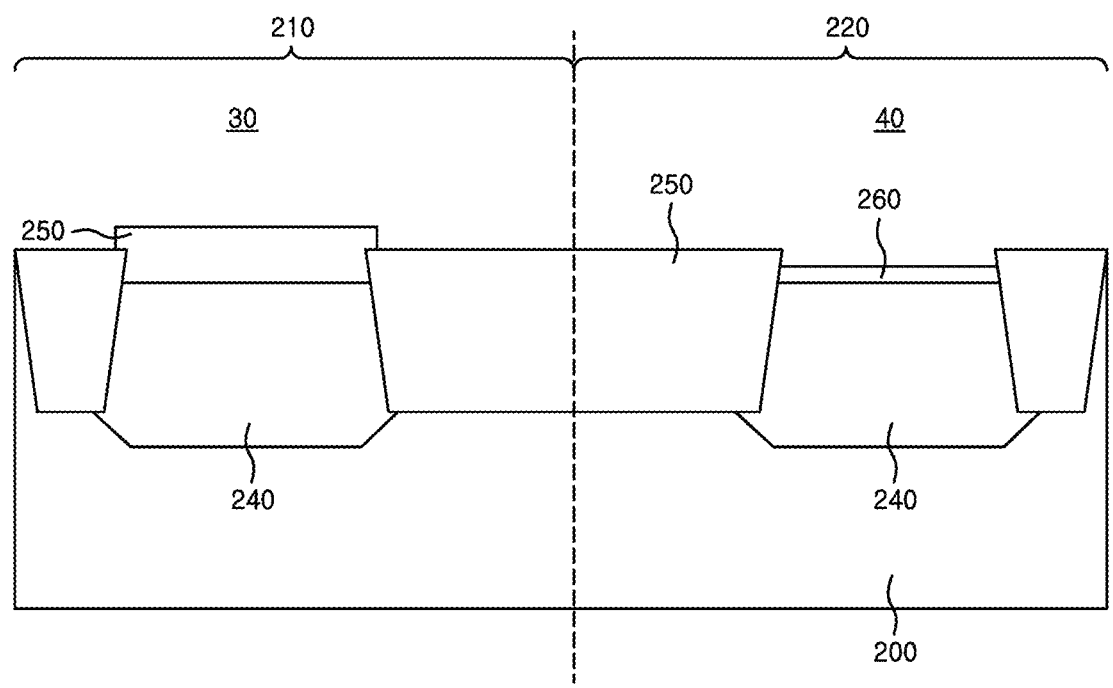

In FIG. 2B, a thin gate insulating layer 260 is formed in the second region according to an example. In the second region 220, a thin gate insulating layer 260 of the low voltage transistor is formed with a thickness between 1 to 5 nm.

In this example, a thin gate insulating layer 260 is formed by providing a thermal oxide film manufactured by the thermal oxidation process. A thermal oxide film is an advantageous approach when a gate insulating layer with a thinner thickness compared to a CVD oxide film is formed. For example, the thermal oxidation process is performed at a temperature between 650-1000° C. While a thin gate insulating layer 260 is formed, the thickness of the thick gate insulating layer 250 is able to be slightly increased. In the end, the first gate insulating layer 250 includes a CVD oxide film combined with a thermal oxide film.

In FIG. 2C, there is presented a cross-sectional view illustrating a step of fabricating a gate electrode on the substrate according to an example. Conductive materials are deposited on the first and the second gate insulating layers 250, 260 and patterning and dry etching processes are also performed. Accordingly, a first gate electrode 280 and a second gate electrode 290 are respectively formed on the first region 210 and on the second region 220. While the heights of the first gate electrode 280 and the second gate electrode 290 are similar, the width of the first gate electrode 280 is longer compared to the width of the second gate electrode 290. In this example, polysilicon materials doped with an N-type or P-type dopant may be used for conductive materials, or a metal electrode such as Tungsten (W) may be used. However, these are only examples, and other appropriate conductive materials may be used as the conductive materials present in this example.

In the example of FIG. 2C, the thicknesses of the second buffer insulating layer 255 or the third insulating layer 265 exposed to the gate side are potentially decreased by the gate patterning etching process. This decrease of thickness is because a gate insulating layer is over-etched while the gate patterning etching process occurs. As the etch selectivity between the gate insulating layer and the polysilicon is higher, etching does not intensively occur in the gate insulation layer. Because of the gate patterning etching process, a source zone 550 and a drain zone 560 are formed to be open on both sides of the gate electrode.

FIG. 3 is a drawing illustrating a manufacturing process of a hybrid transistor according to an example.

Figure 3A:
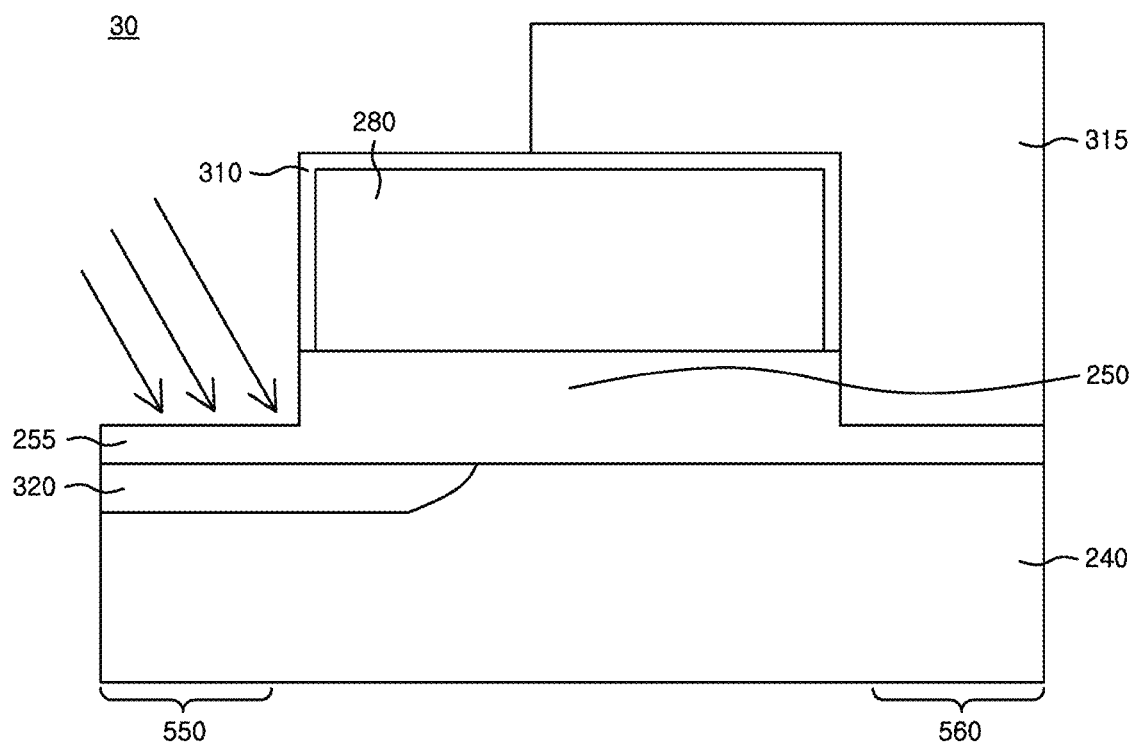
FIGS. 3A-3C are drawings illustrating a manufacturing process of a hybrid transistor according to an example.

As illustrated in the example of FIG. 3A, an additional etching process is required to further decrease the thickness of the buffer insulating layer 255 situated outside the gate electrode. Such an additional etching process is performed for the formation of an appropriate LDD region having a suitable implantation depth. Namely, the etching process is formed because the ion injection for LDD region is interfered with when the thickness of the buffer insulating layer 255 disposed outside the gate electrode is thick.

To achieve a low on resistance (Low Ron), it is desirable that the thickness of the insulating layer 255 remaining on the substrate is decreased below the predetermined thickness. When a thick buffer insulating layer remains on the substrate, the depth of ion injection becomes shallow accordingly, and the RDSon value increases as well.

Furthermore, when the buffer insulating layers 255 has a very thin thickness, the substrate may be damaged during the ion-injection process. Therefore, a certain thickness of the buffer insulating layer 255 is required. In a method according to an example, the desirable thickness of the insulating layer 255 on the side of the gate electrode 280 is less than 40% of the thickness of the thick gate insulating layer 250 below the gate electrode 280.

Hydrofluoric (HF) acid solution or diluted hydrofluoric acid (Diluted HF: DHF) solution is used for the additional etching process. Such a DHF solution is advantageous for the etching of the insulating layer because the solution has a good selective etching rate between a silicone oxide film and a silicone substrate and its etching speed is rapid.

By performing the additional etching process, the buffer insulating layer 255 is etched by 80 to 90 nm. Accordingly, by the additional etching process, the thickness of the buffer insulating layer 255 becomes 40 to 50 nm. Therefore, the thickness of the buffer insulating layer 255 decreases to become less than 50% of the thickness of the thick gate insulating layer 250. The desirable thickness of the buffer insulating layer 255 on the substrate is 10 to 50% of the thickness of the thick gate insulating layer 250, chosen to appropriately inject ions for the formation of a LDD region 320. Accordingly, it is preferable to adjust the thickness of the thin buffer insulating layer on the substrate to become 10 to 40% of the thickness of the thick gate insulating layer.

In the example of FIG. 3, the additional etching process is also applied to the high voltage transistor 20 under the same conditions. Therefore, the thickness of the first insulating layer 245 is 10 to 40% of the thickness of the thick gate insulating layer 240 located under the sidewall spacer 440.

As illustrated in FIG. 3A, a side wall oxide film 310 is formed through sidewall oxidation or light oxidation after the additional etching process occurs. Sidewall oxidation cures defects caused by etching damage to the gate electrode and substrate after gate etching is performed. Thus, as illustrated in FIG. 3A, a first side wall oxide film 310 is formed on the side wall of the gate by sidewall oxidation.

Sidewall oxidation is performed before the formation of the LDD region. Furthermore, sidewall oxidation is performed by a thermal oxidation method, not by chemical vapor deposition, and a silicone oxide film (SiO$_2$) is formed on the exposed surface of the gate electrode.

As illustrated in FIG. 3A, after sidewall oxidation, a first PR mask 315 is formed. The first PR mask 315 is formed for the purpose of forming a shallow LDD region on the source zone 550. The region covered by the first PR mask 315 includes a portion of the surface of the gate electrode 280 as well as the drain zone 560. The PR mask pattern extends to the center of the gate electrode 280. Also, a shallow LDD region is formed by ion injection in the source zone 550.

An N-type shallow LDD region 320 is formed on the source zone of the hybrid transistor by applying LDD Implantation. Such implantation is identically applied to the similar implantation of the low voltage transistor. Accordingly, the shallow LDD region 320 is vertically overlapped with a region below the gate electrode 280.

Figure 3B:
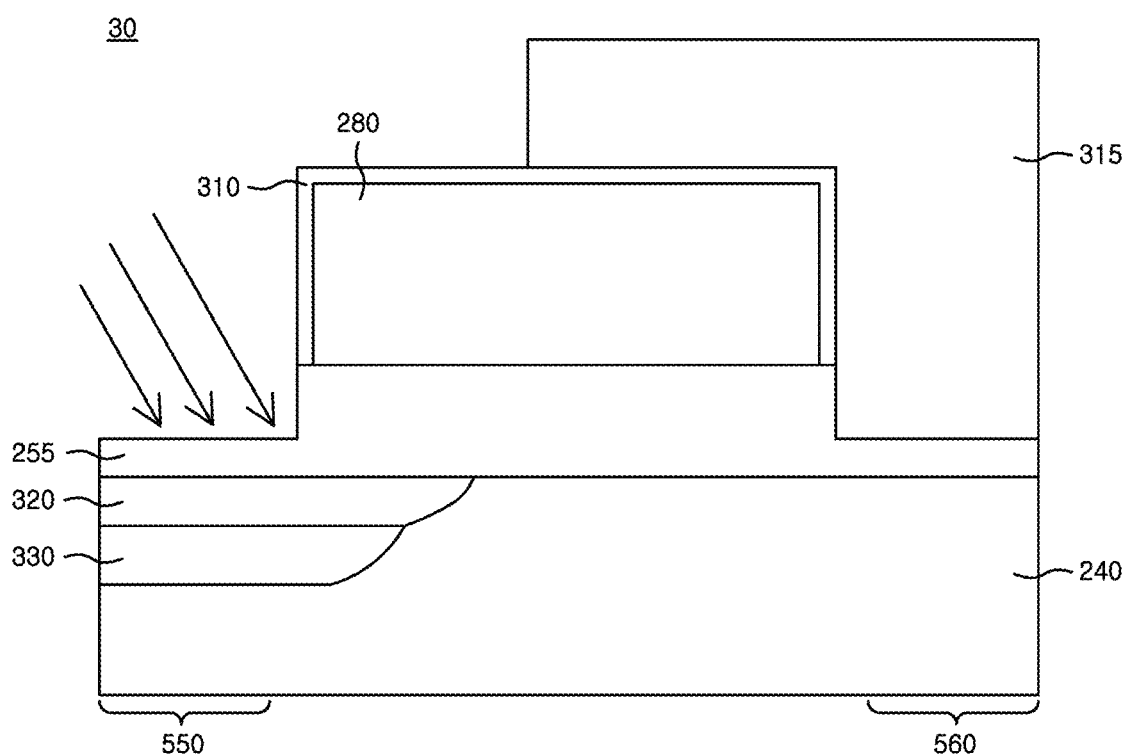

Next, as illustrated in FIG. 3B, a pocket or Halo region 330 is formed on the source zone 550 by using a P-type dopant. A similar method applies here to that which is also applied to the low voltage transistor. For example, the pocket or Halo region 330 may be formed by tilt ion injection.

Figure 3C:
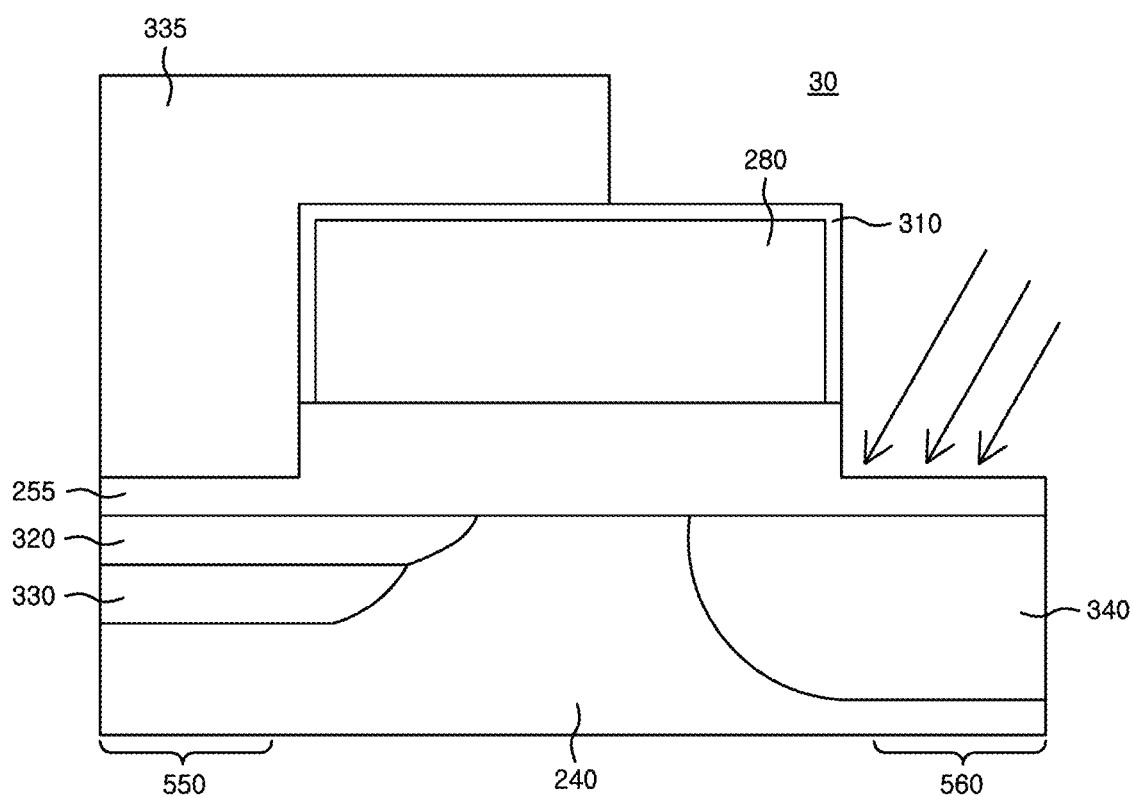

Next, as illustrated in FIG. 3C, a second PR mask 335 is formed after the first PR mask 315 is removed. In the example of FIG. 3C, an N-type low concentration deep LDD region 340 is formed in the drain zone 560 of a hybrid transistor. According to such an example, a deep LDD region 340 is formed to surround the drain region 460 and the deep LDD region 340 has a deeper depth than the shallow LDD region 320 and the P-type Halo region 330. The deep LDD region 340 is formed by combining tilt and rotation techniques during ion injection. In such an example, the dose amount of the deep LDD region is assigned so that the deep LDD region is caused not to be electrically disconnected from the source structure 650. However, when too much amount of a dopant is ion injected, the ion injection potentially comes into contact with the shallow LDD region 320 of the source structure 650. Next, the second PR mask 335 is removed.

Figure 4A:
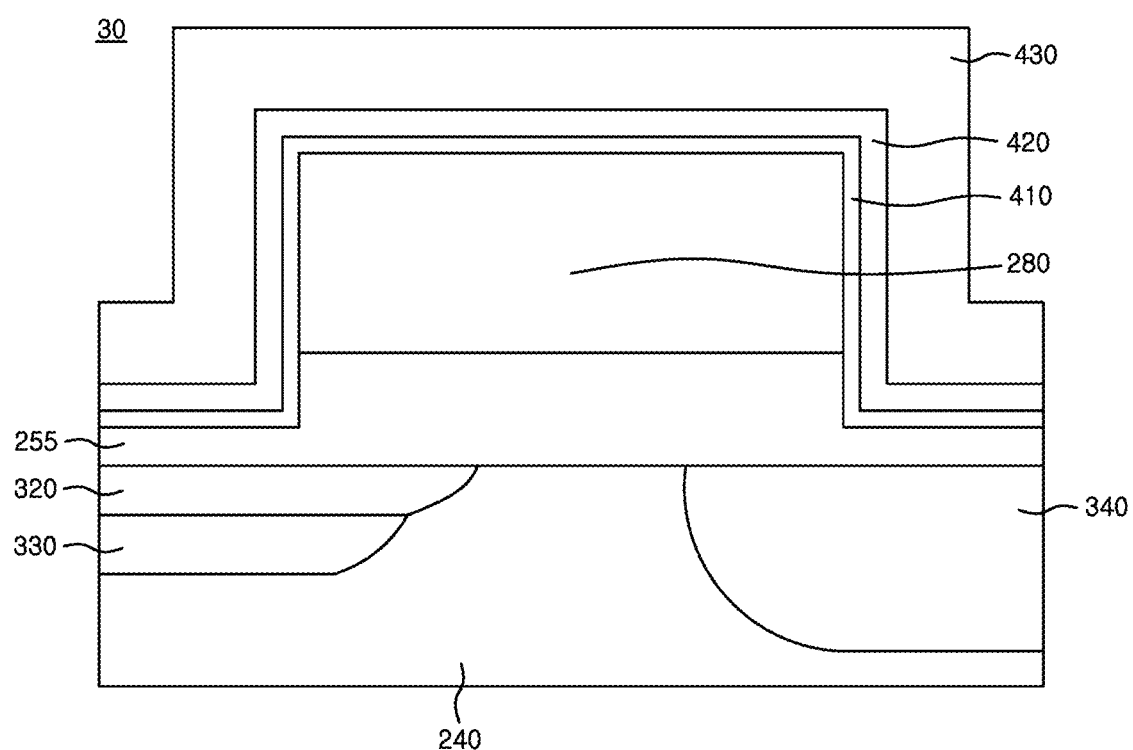

FIG. 4 is a drawing illustrating a process of forming a spacer and source/drain region of a hybrid transistor. In the example of FIG. 4A, a first CVD oxide film 410 is formed so as to form a LDD spacer. A second CVD silicon nitride film 420 is deposited on the first CVD oxide film 410. Further, a third CVD oxide film 430 is additionally deposited on the second CVD silicon nitride film 420 to further increase the thickness of the spacer. In this example, the third oxide film 430 is formed to be thicker than the first oxide film 410.

Figure 4B:
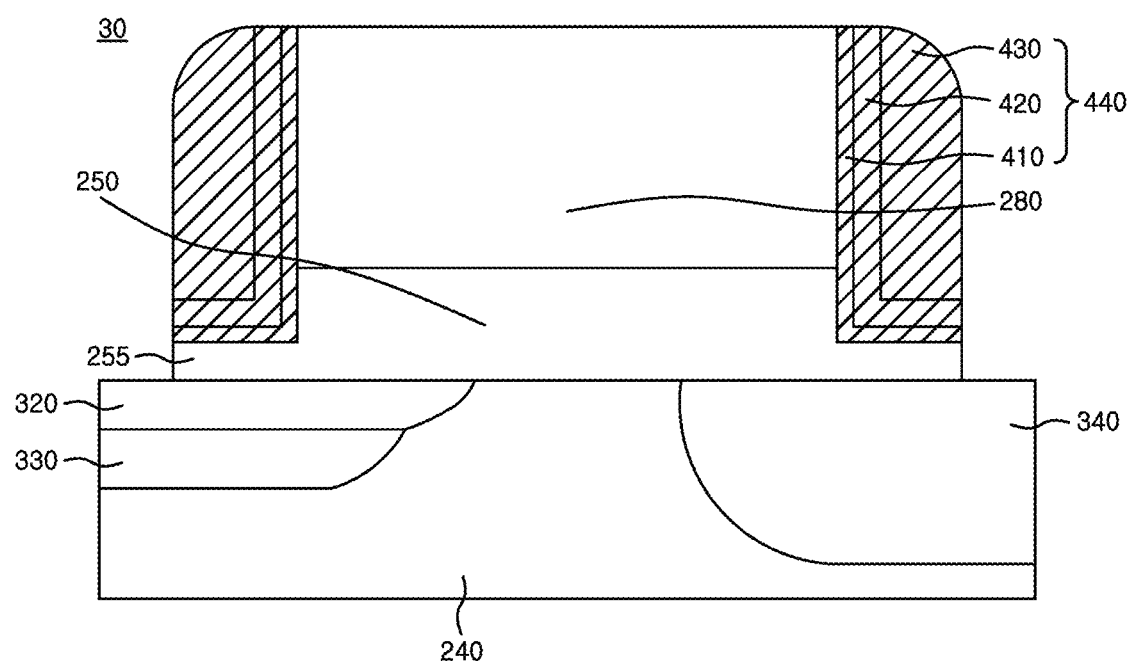

Next, as illustrated in FIG. 4B, a spacer 440 is finally formed on the side of the gate electrode 280 through a blanket etching process. The spacer 440 is formed of at least three different insulating films 410, 420, 430. A spacer including a three-layered insulating layer structure is more efficient in relieving stress imposed on the substrate or the gate electrode than a spacer formed of a two-layered insulating layer.

FIG. 4C is a drawing illustrating a process of forming source and drain structures according to an example. As illustrated in the example of FIG. 4C, the source and drain regions 450, 460 are formed by an implantation process. The drain region 460 may formed as being surrounded by a deep LDD region 340. As a result, the source structure 650 includes a source region 450, a low-concentration shallow LDD region 320, and a Halo or pocket region 330. Furthermore, the drain structure 660 includes a drain region 460 and a low-concentration deep LDD region 340. In such an example, the source/drain structures 650, 660 signify structures respectively formed on the source/drain zones 550, 560.

The threshold voltage (Vt) of an NMOS hybrid transistor manufactured according to an example is able to be adjusted below 1.0 V, and the value of RDSon may be below 2KΩμm. Further, the value of Ioff (off current), which signifies the leakage current, may be 0.001 to 0.010 PA/μm. The BV value that signifies the breakdown voltage is more than 10 V. The BV value is higher than the Operation voltage. For example, the operating voltage may be 4-6V. The hybrid semiconductor device according to an example decreases scattering of the threshold voltage (Vth) of the low voltage transistor, and it is detectable that the RDSON is reduced accordingly.

Figure 5:
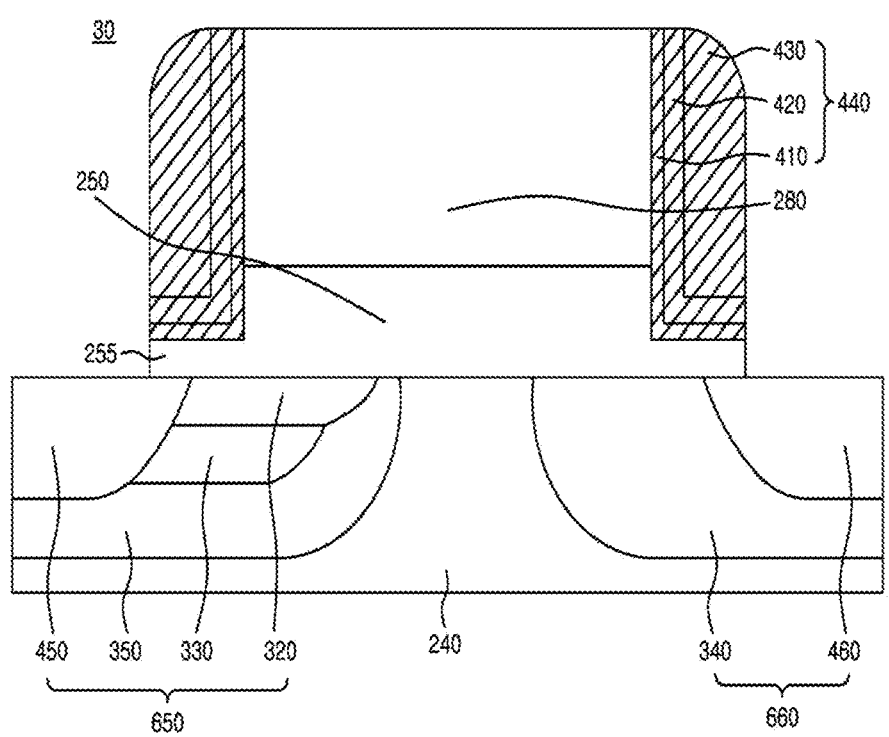
FIG. 5 is a cross-sectional view of a hybrid transistor according to another example.

FIG. 5 is a cross-sectional view of a hybrid transistor according to an example. In the example of FIG. 5, a deep LDD region 350 is additionally formed in the source zone 550. For example, the deep LDD region 350 is formed as surrounding a source region 450. The deep LDD region 350 of the source structure 650 is formed at the same time at which the deep LDD region 340 of the drain structure 660 is formed. The values of Vt and RDSon may be adjusted to be lower by additionally forming a low-concentration deep LDD region 350 in the source zone. When finished, a source structure 650 according to an example includes a source region 450, a low-concentration shallow LDD region 320, a Halo or pocket region 330, and a low-concentration deep LDD region 350. The drain structure 660 includes a drain region 460 and a low-concentration deep LDD region 340. In such an example, the source/drain structures 650, 660 respectively signify the structures formed in the source/drain zones 550, 560.

The voltage (Vt) of an NMOS hybrid transistor manufactured according to an example may be adjusted to be below 1.0 V, and the value of RDSon may be below 2KΩμm. The values of Vt and RDSon decrease further compared to FIG. 4C. Such a decrease occurs because the N-type concentration of the channel region near the source zone increases. However, in such an example the value of the breakdown voltage may be lower compared to that of FIG. 4C because the N-type concentration increases.

Hence, in summary, the method of manufacturing a semiconductor device according to an example includes forming gate insulating layers 241, 250, 260 on the substrate 200, depositing conductive materials on the gate insulating layers 241, 250, 260, forming gate electrodes 270, 280, 290 by patterning the conductive materials, forming sidewall oxide films by oxidizing the side walls of the gate electrodes 270, 280, 290, forming LDD regions in the substrate, forming a spacer 440 on sidewalls of the gate electrode, and forming source/drain regions in the substrate.

For example, the spacer includes the first, the second, and the third insulating layers. The first and the third insulating layers are formed by oxide films, and the second insulating layer is formed by a nitride film. In this example, the second thickness is 10% to 40% of the first thickness.

Furthermore, another example of the semiconductor device may be manufactured such that a shallow LDD region of the first conductivity, a Halo region of the second conductivity, and a source region of the first conductivity deeper than the shallow LDD region are formed. Also, a first deep LDD region 350 of the first conductivity surrounding the source region is formed. Subsequently, a drain region 460 of the first conductivity type and a second deep LDD region 340 of the first conductivity surrounding the drain region 460 on the drain zone are formed. In such an example, the first and the second deep LDD regions 340, 350 of the semiconductor device have the same depth.

Figure 6A:
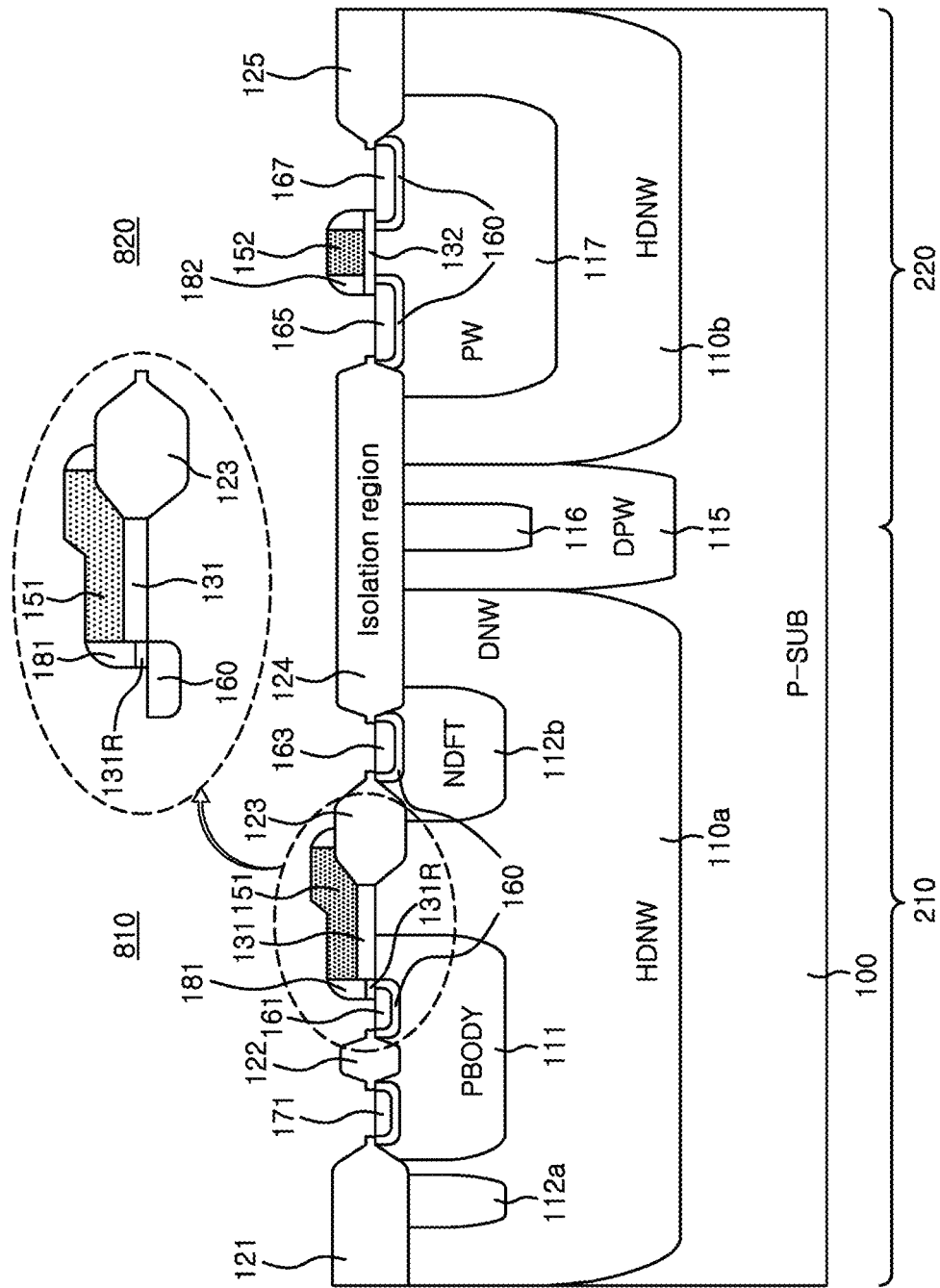
FIGS. 6A and 6B are diagrams that illustrate an integrated semiconductor device.

FIG. 6A is a diagram that illustrates an integrated semiconductor device.

In the example of FIG. 6A, a high voltage MOSFET 810 and a logic transistor or low voltage MOSFET 320 are formed on a P-type substrate 100. The high voltage MOSFET 810 may include an LDMOS or an EDMOS. However, these are merely example types of transistors, and other appropriate transistors are used in other examples. In such an example, the high voltage MOSFET 810 may have symmetric or asymmetric source/drain structures. However, in the example of FIG. 6A, the high voltage MOSFET 810 has an asymmetric source/drain structure, for purposes of illustration. In such an example, the substrate is divided into a first region 210 and a second region 220 for convenience. The high voltage MOSFET 810 is formed on the first region 210. Furthermore, the logic transistor 820 is formed on the second region. For example, the first region is applied to a drain region with a voltage ranging from 5 to 200V. In such an example, a low voltage of under 5V is applied to a drain region 167 in the LV transistor. In the example of FIG. 6A, the first region refers to a first region and the second region refers to the logic region or the second region. Accordingly, a gate insulating layer formed on the first region is formed to be thicker than the thin gate insulating layer formed on the logic region or second region.

Furthermore, in the example of FIG. 6A, a first deep N-well region 110a and second deep N-well region 110b are formed in the substrate. Additionally, a P-type junction isolation region 115 is formed between the first deep well region 110a and the second deep well region 110b. In such an example, the junction isolation region 115 is able to electrically separate the first deep well region 110a and the second deep well region 110b. For example, the junction isolation region 115 is formed by ion injecting a dopant of a second conductivity type. Because of the smaller the design rule, a deep trench isolation, with reference to FIG. 6A, is able to be formed instead of a junction isolation region 115. This structure is possible because the junction isolation region 115 consumes a large surface. Accordingly, the chip size is able to be reduced by forming the trench isolation region. Additionally, a P-type well region 116 may be formed in the junction isolation region 115 and may have a higher concentration than a junction isolation region 115. Furthermore, a contact plug may be formed on the P-type well region 116. As a result, a consistent voltage such as a power voltage or a ground voltage is applied to the P-type well region 116 and the junction isolation region 115 for device isolation.

Furthermore, a first N-drift region 112a and a second N-drift region 112b type are formed in the first deep well region 110a. Additionally, according to the example of FIG. 6A, a P-type body region 111 is formed in the N-type deep well region 110a. In such an example, a channel region is formed in the P-type body region 111, and a P-type well region 117 is formed in a deep well region 110b in a logic transistor. The P-type well region 117 and the body region 111 may be formed simultaneously using the same ion-injecting energy and dose amount. By using such an approach, there is an advantage of simplifying the manufacturing process. However, in another example, the P-type well region 117 and the P-type body region 111 are formed with a different ion injecting energy and dose amount. However, in such an approach, an additional mask process may be required.

In this example, a first N-type drift region 112a is formed below a first device isolation region 121 and the first N-type drift region 112a prevents an extension of the P-type body region 111. Alternatively put, the first N-type drift region 112a prevents the extension of the depletion region of the P-type body region 111. Also, the second N-type drift region 112b is required to increase the breakdown voltage of the semiconductor, and the second N-type drift region 112b reduces an electric field on the surface of the semiconductor between the drain region and the channel region. Furthermore, in such an example, an N-type drain region 163 is formed in the second N-type drift region 112b. For example, the drain region 163 has a higher dopant concentration than that of the second N-type drift region 112b. Accordingly, the N-type source region 161, a P-type body contact region 171 and the LDD region 160 are formed together in the P-type body region 111. Furthermore, the body contact region 171 and the source region 161 are separated from one another by using a second device isolation region 122. Thus, separate biases may be applied to the body contact region and the source region. Furthermore, a source region 165 and a drain region 167 are formed in the logic transistor 820. Additionally, a thin gate insulating layer 132 and a gate electrode 152 are formed on the substrate 100.

In the example of FIG. 6A, a thick isolation layer 123 is formed between the first gate electrode 151 and the substrate, and the thick isolation layer 123 reduces a surface electric field, hereinafter referred to as RESURF. As a result, a voltage higher than 20V may be applied onto the drain region 163. The thick isolation layer 123 may be formed with LOCOS or Shallow Trench Isolation (STI) techniques or a planar-type CVD oxide technique. In such an example, the drain region 163 is formed to be separated by a predetermined spacing apart from the first gate electrode 151. A fourth device isolation layer 124 acts as a device isolation layer to separate a first region from a second region. The first device isolation layer 121 and the second device isolation layer 125 are required to electrically separate various devices from other devices. Thus, a P-type isolation region may be formed below the first device isolation layer 121 and the second device isolation layer 125.

The thick gate insulating layer 131 is formed on a first region 210. Furthermore, a thin gate insulating layer 132 is formed on the second region 220. The thick gate insulating layer 131 and the first gate electrode 151 are formed to overlap with the P-type body region. Accordingly, a channel region is formed below regions of the thick gate insulating layer 131 and the first gate electrode 151. Furthermore, a first spacer 181 and the second spacer 182 are formed on the opposite sidewalls of the first gate electrode 151 and the second gate electrode 152, respectively.

Referring to the enlarged image of the example of FIG. 6A, a first buffer insulating layer 131R still remains under the first spacer 181. Accordingly, the first buffer insulating layer 131R is connected with the thick gate insulating layer 31 that is formed under the first gate electrode 151. According to the present disclosure, it is preferable to maintain the thickness of the first buffer insulating layer 131R that is formed under the first spacer 181 as being 10 to 50% of the thickness of the thick gate insulating layer 131 under the first gate electrode 151. Such a thickness is suitable for the LDD region formation.

Figure 6B:
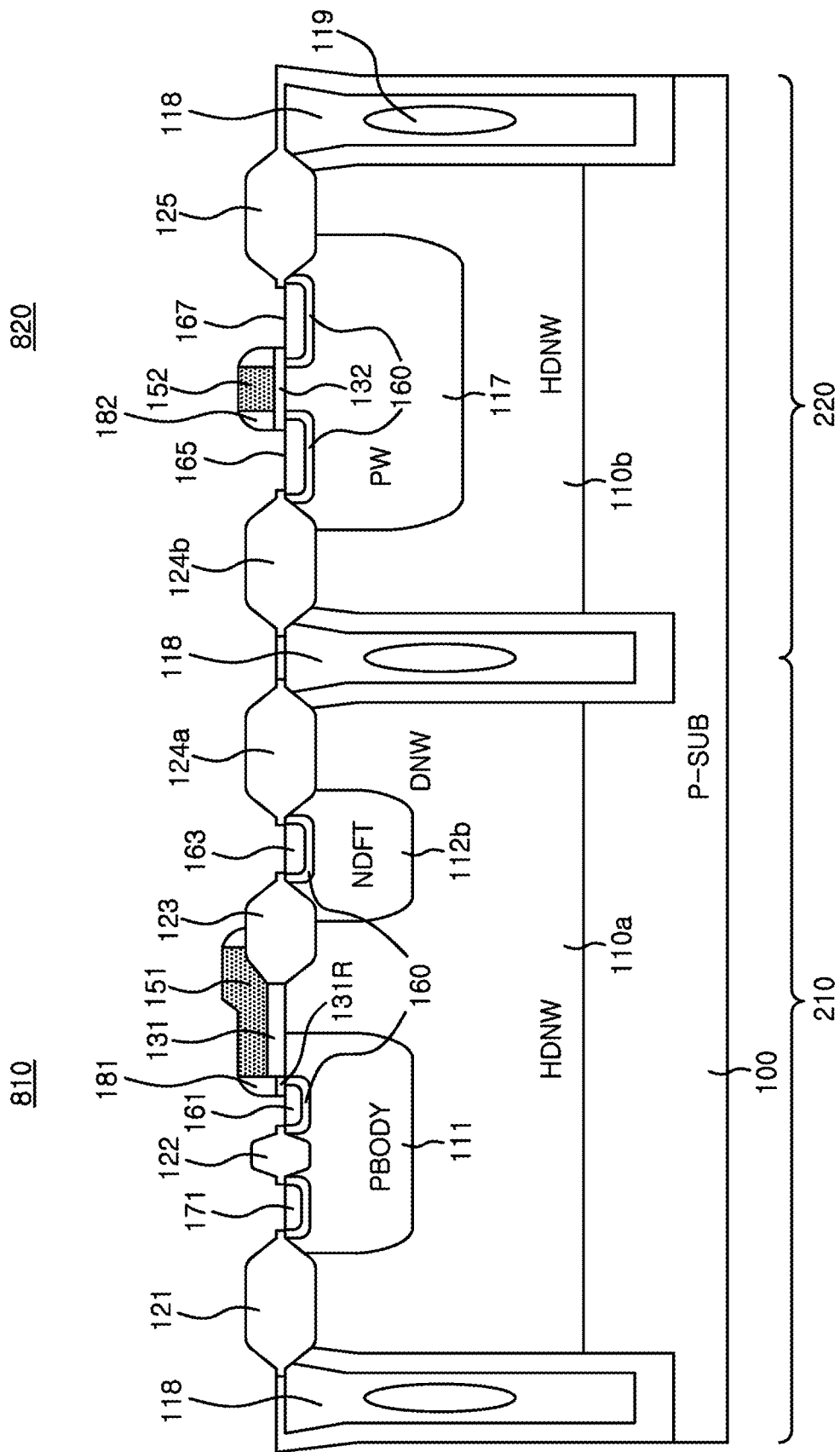

FIG. 6B is a cross sectional view of another example of a semiconductor device.

As illustrated in the example of FIG. 6B, the semiconductor device includes a deep trench isolation (DTI) 118 formed between the first region 210 and the second region 220. Using such an approach may reduce the chip area because a chip manufactured using such an approach has a relatively smaller width than the isolation region 124 and 115 illustrated in the example of FIG. 6A. In such an example, the DTI 118 is formed to be deeper than the first N-type deep well region 110a and the second N-type deep well region 110B. As a result, such an approach may block leakage current between the first region 210 and the second region 220. For example, a void 119 may be formed in the DTI region 118 through using the semiconductor device manufacturing process. The electrical isolation function between the neighboring devices increases due to the void 119. Furthermore, as shown in the example of FIG. 6B, LOCOS structures 124A and 124B are formed on the opposite sides of the deep trench structure (DTI). However, in another example, a thin trench structure (STI) is used instead of the LOCOS. When LOCOS and STI approaches are used, such approaches may relieve the stress applied to the substrate more effectively than when there is only a DTI structure. Furthermore, such an approach may further electrically separate the high voltage MOSFET 810 and logic transistor 820. Additional explanation is omitted because the remainder of the features and elements of FIG. 6B have a simultaneous functionality with respect to corresponding elements of FIG. 6A.

Figure 7A:
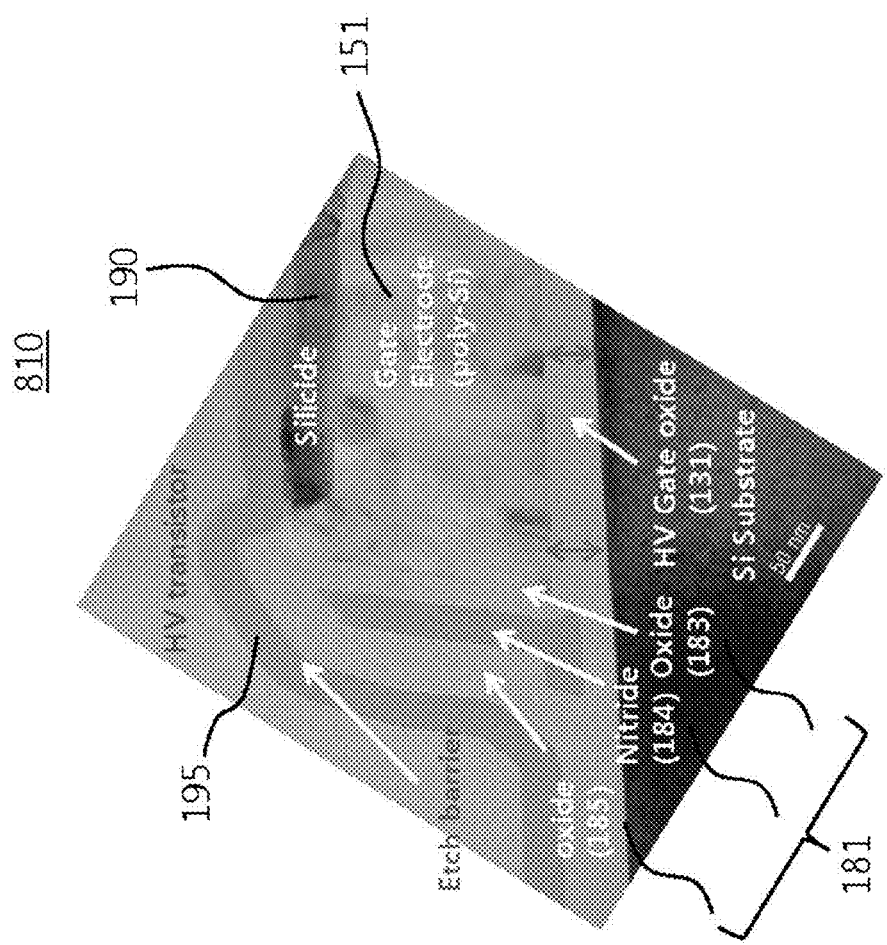
FIG. 7A is a diagram that illustrates a LDMOS transistor.
Figure 7B:
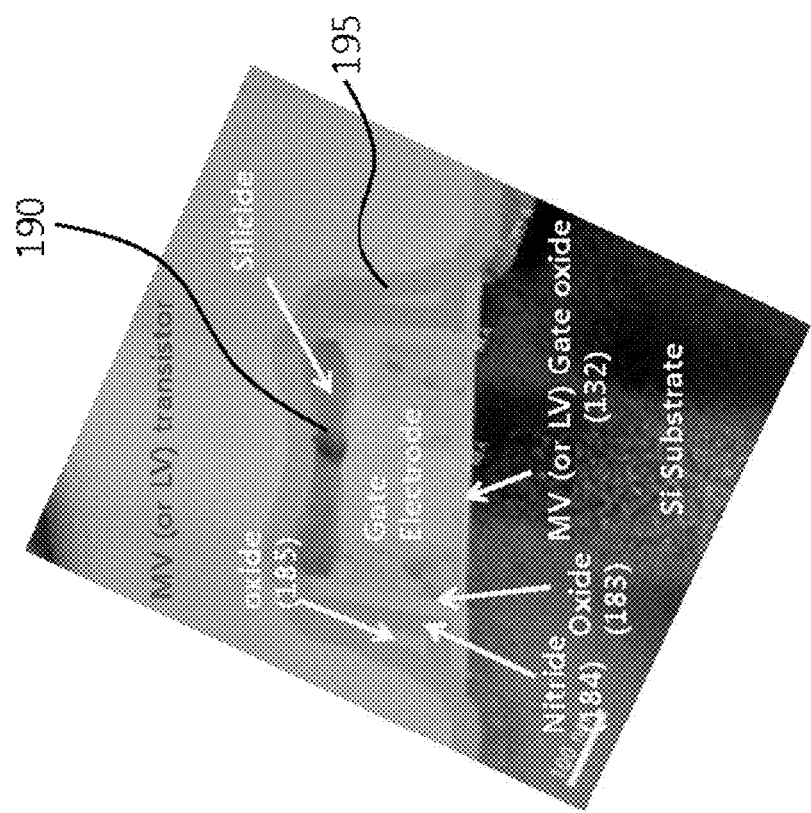
FIG. 7B is a diagram that illustrates a logic transistor.

FIG. 7A illustrates a cross sectional view of a Transmission Electron Microscope (TEM) image of a LDMOS transistor. FIG. 7B illustrates a cross sectional view of a logic transistor TEM image. As illustrated in the examples of FIG. 7A and FIG. 7B, the gate insulating layer 131 of a LDMOS transistor has a thickness of 30 to 120 nm and is thicker than the thin gate insulating layer 132 of the logic transistor or the lower voltage transistor. Furthermore, the thick gate insulating layer 131 is formed to be relatively thicker near to the edge of the gate electrode than the center of the gate electrode. Accordingly, the thick gate insulating layer 131 has the thickest gate insulating layer in the edge of the gate electrode. For example, a metal silicide layer 190 may be formed on the first gate electrode 131 and the second gate electrode 132 in order to reduce gate resistance. Furthermore, a CVD insulating layer 195 is formed on the gate electrodes 131 and 132, silicide 190 and substrate 100. When forming a hole to form a contact plug, in an example, it is preferable to form the CVD insulating layer 195 as an a etch stop layer. Thus, the first gate electrode 131 and the second gate electrode 132 are protected during the formation of the contact plug.

Furthermore, in such an example, spacers 181 and 182 are formed on the opposite sides of the gate electrodes. As illustrated in the examples of FIG. 7A and FIG. 7B, each spacer 181 and 182 includes a stacked structure of a first oxide layer 183, a second nitride layer 184, and a third oxide layer 185. In such an example, the second nitride layer 184 relieves stress on the Si substrate.

Hereinafter, the following discussion explains and illustrates the manufacturing method of a semiconductor device with reference to FIG. 8 to FIG. 18.

FIG. 8 shows a first region, a second region and a third region that are defined in the P-type substrate 100 by using an isolation region 115. A first N-type deep well region 110a, a second N-type deep well region 110b, and a third deep N-type well region 110c are formed on the respective regions of the P-type substrate 100. Also, respective N-type deep well regions 110a, 110b and 110c may be formed simultaneously by using an identical process. For example, a P-type isolation region 115 is formed in the boundary of the first region, the second region and the third region. Also, in such an example, a P-type well region 116 is further formed in the P-type isolation region 115. In such an example, the depletion region is controlled by applying a bias to the junction isolation region 115. For example, a P-type body region 111 is formed in the first deep well region 110a. The P-type body region 111 has a channel function of the LDMOS transistor. In such an example, the first N-type drift region 112a and the second N-type drift region 112b are formed to be separate from each other.

Figure 9:
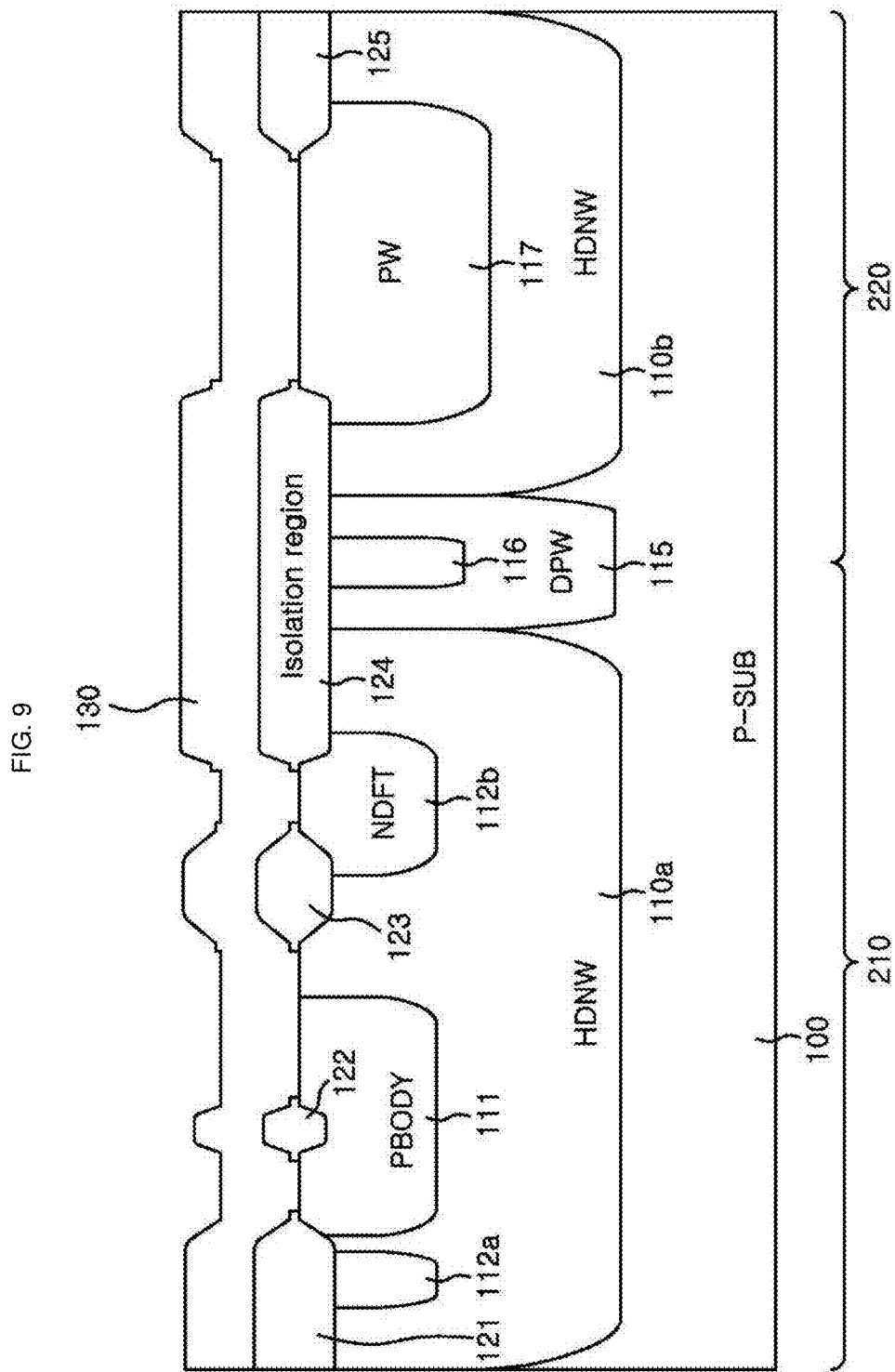
FIG. 9 is a diagram that illustrates a plurality of device isolation layer and gate insulating layer.

FIG. 9 is a diagram that illustrates a plurality of device isolation layers and gate insulating layers. In the example of FIG. 9, a P-type logic well region 117 is formed in the deep well region 110. As aforementioned, the P-type logic well region 117 and the P-type body region 111 may be simultaneously formed using the same ion injecting energy and dose amount. Such an approach may be used because there is an advantage of simplifying the manufacturing process by including an ion injecting energy and a dose amount that are the same. Furthermore, considering the feature of the logic transistor or the low voltage transistor, the P-type logic well region 117 and the P-type body region 111 may be formed having a different ion injecting energy and dose amount, and then an additional mask process may be necessary.

Furthermore, a plurality of device isolation layers 121, 122, 123, 124, and 125 are formed on the substrate with a LOCOS (Local Oxidation Silicon), STI (Shallow Trench Isolation), MTI (Medium Trench Isolation) approach. A thick gate insulating layer 130 is formed on the substrate.

For example, the thick gate insulating layer 130 is formed to have a CVD oxide layer. Additionally, in such an example, a thick gate insulating layer 130 is formed simultaneously on the first region 210 and the second region 220. For example, the thick gate insulating layer 130 has a thickness of 30-120 nm in the LDMOS transistor.

Figure 10:
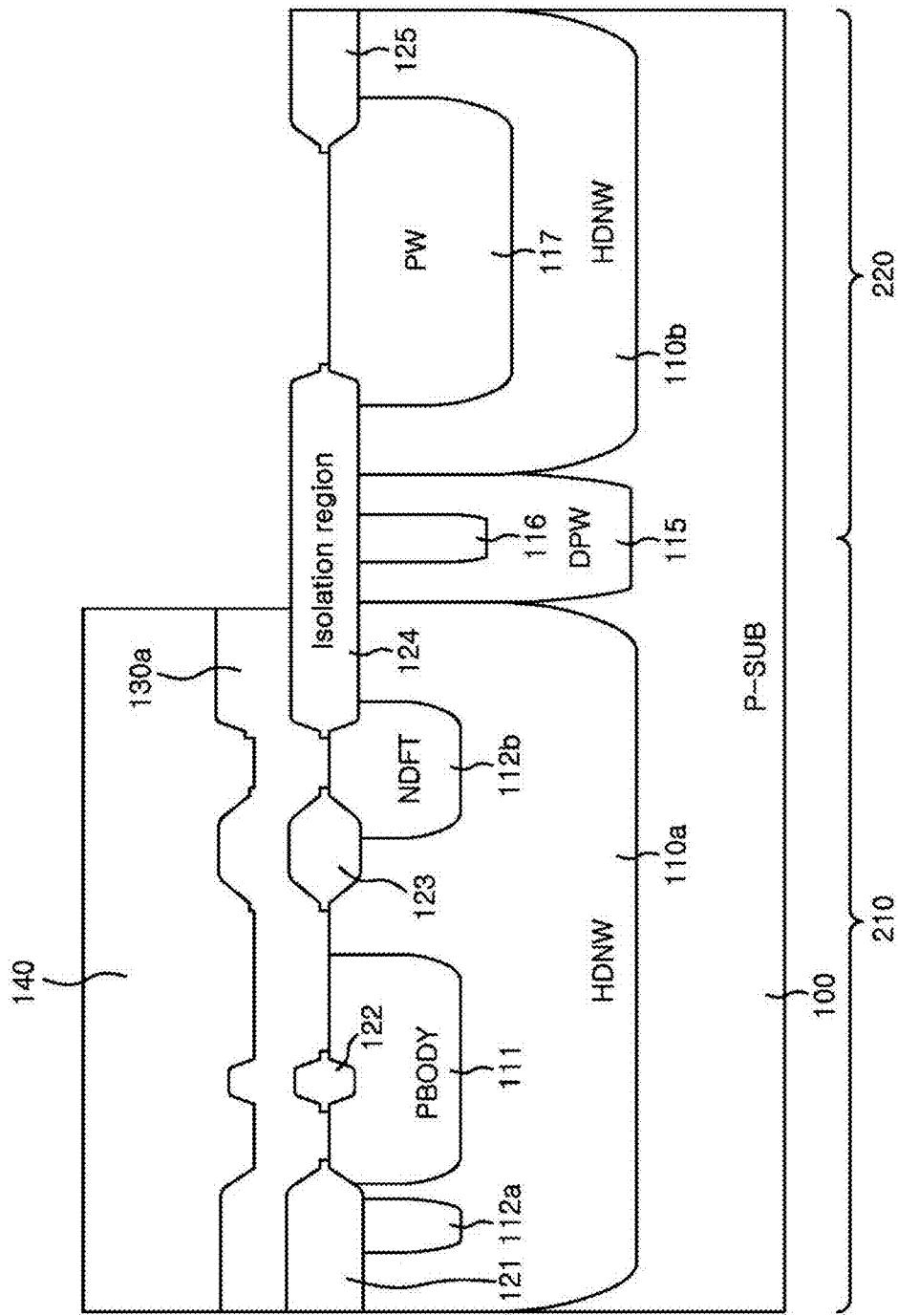
FIG. 10 is a diagram that illustrates etching a part of a region after forming a thick gate insulating layer on the substrate.

FIG. 10 is a diagram that illustrates selectively forming a thick gate insulating layer 130 on the first region 210. In the example of FIG. 10, a PR mask pattern 140 covers the thick gate insulating layer 130 in the first region 210. The thick gate insulating layer is exposed in the second region 220. Next, selectively removing the thick gate insulating layer 130 that is formed on the second region 220 is performed by conducting wet etching, which occurs by using chemicals to remove the thick gate insulating layer 130. Accordingly, the substrate 100 is exposed. Furthermore, removing the PR mask pattern 140 is performed as well.

Figure 11:
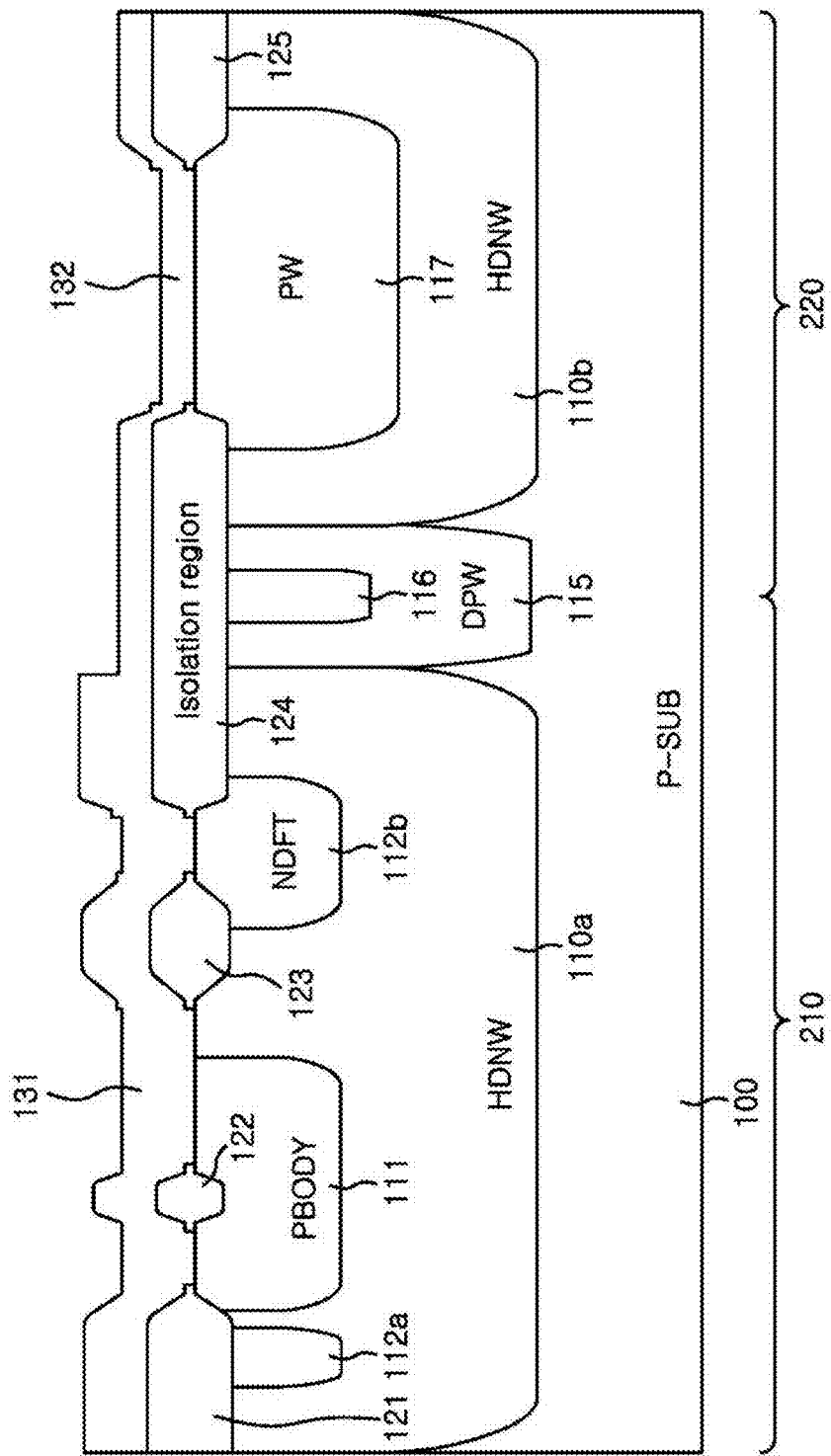
FIG. 11 is a diagram that illustrates forming a thin gate insulating layer on the substrate.

FIG. 11 is a diagram that illustrates forming a selectively thin gate insulating layer 132 on the second region 220. In the example of FIG. 11, the thin gate insulating layer 132 becomes the thin gate insulating layer 132. For example, the thin gate insulating layer 132 has a thickness of 2-29 nm. In such an example, the thin gate insulating layer 132 is grown by a thermal oxidation process which can be conducted in a temperature from 750 to 1000° C. During the process of growing the thin gate insulating layer 132, the thickness of the thick gate insulating layer 130 may be slightly increased, as well.

Figure 12:
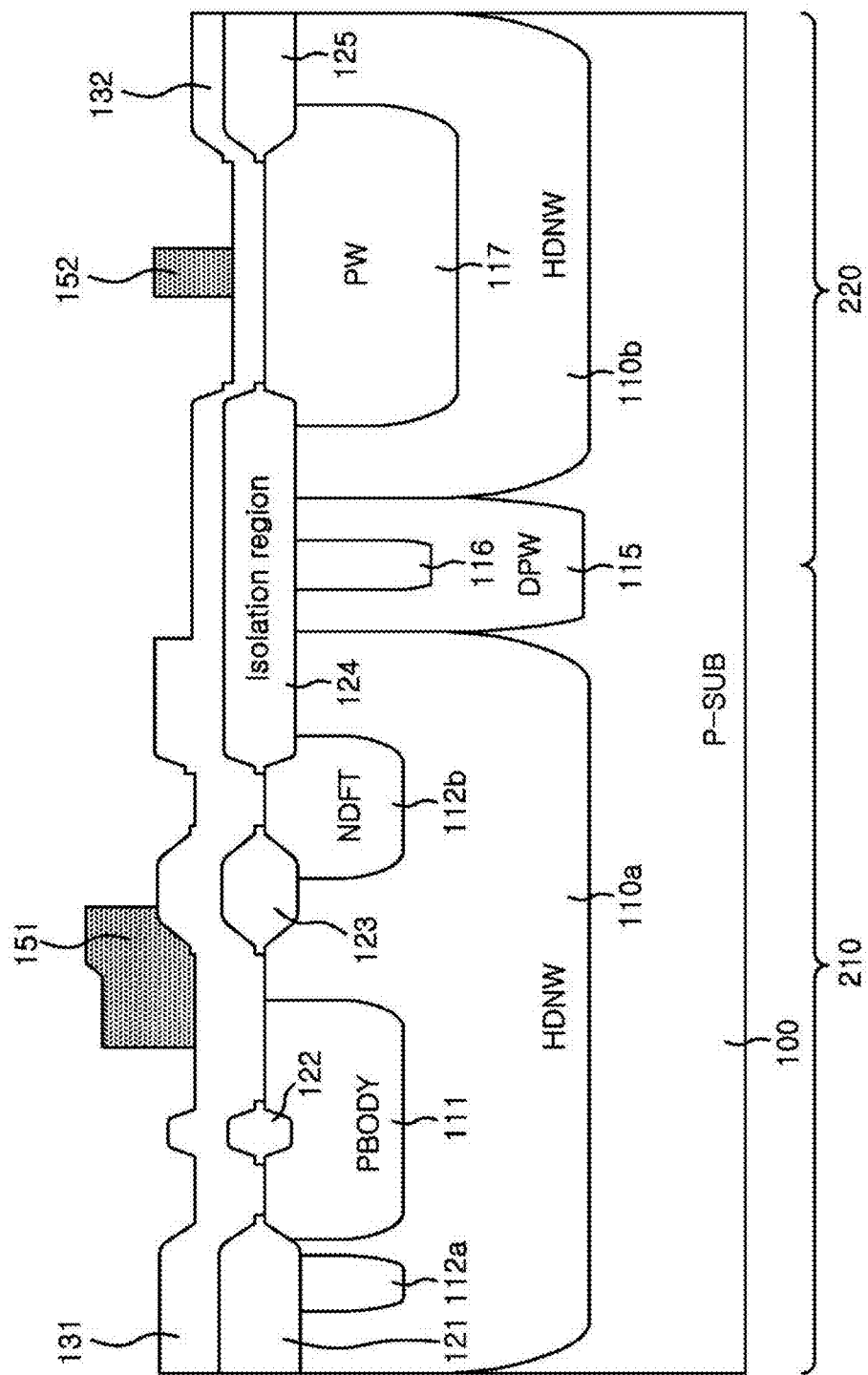
FIG. 12 is a diagram that illustrates forming a first gate electrode and a second gate electrode.

FIG. 12 illustrates forming a first gate electrode 151 and a second gate electrode 152.

The conductive material, for example, polysilicon, is deposited on the gate insulating layer. Next, PR patterning and dry etching are performed. Thus, both the first gate electrode 151 and the second gate electrode 152 are formed on the thick gate insulating layer 131 and the thin gate insulating layer 132, respectively. In the example of FIG. 12, the heights of the first gate electrode 151 and the second gate electrode 152 are similar to one another. However, the width or length of the first gate electrode 151 may be longer than the width or length of the second gate electrode 152. A polysilicon material is doped with an N-type dopant or P-type dopant. Such doping renders the polysilicon material conductive. In another example, a tungsten (W) metal gate is used, instead of polysilicon. However, tungsten and polysilicon are only example materials and other appropriate materials with suitable conductive properties are used in other examples. In the example of FIG. 12, a thick gate insulating layer 131 and a thin gate insulating layer 132 disposed outside the gate electrodes 151 and 152 are partially etched during the etching of the gate electrode 151. Accordingly, the thicknesses of the thick gate insulating layer 131 and the thin gate insulating layer 132 is slightly decreased compared to the initial thickness of these layers.

Figure 13:
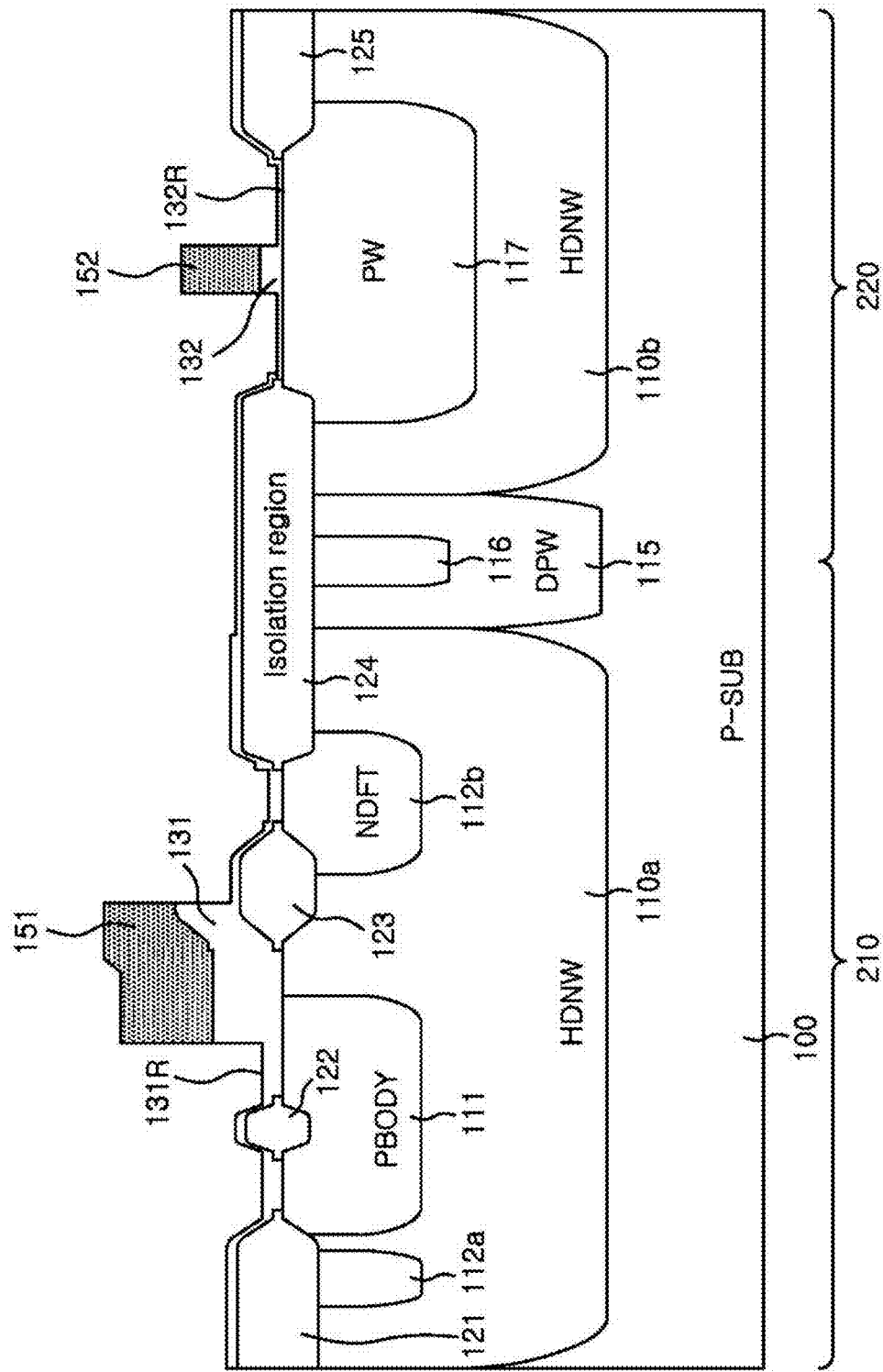
FIG. 13 is diagram that illustrates a pre-cleaning process and an additional etching process.

FIG. 13 illustrates an additional wet etching process. For example, in the example of FIG. 13, the thick gate insulating layer 131 being disposed outside the gate electrode 151 causes blocking ion injection of LDD region into a substrate. Accordingly, additional wet or dry etching is required to lower the thickness of the thick gate insulating layer. The subsequent discussion illustrates a pre-cleaning process and an additional etching process with reference to FIG. 13.

First, a wet cleaning process is performed to remove particles that are attached on the wafer. In the example of FIG. 13, the thick gate insulating layer 131 and the thin gate insulating layer 132 disposed outside the gate electrodes 151 and 152 are slightly etched by the first wet cleaning process. For example, a second wet etching process is performed to lower the thickness of the thick gate insulating layer 131 disposed outside the gate electrode, such that the thick gate insulating layer 131 has a second thickness 131R in a particular region. For example, the second wet etching process employs a diluted DHF (Diluted HF) solution including hydrofluoric acid that provides a higher etching rate for forming the gate insulating layer. By performing the second wet etching process, the thick gate insulating layer 131 has the second thickness less than 50 nm. During the second wet etching process, the thin gate insulating layer 132 is also etched by the DHF solution. For example, the preferred etched thickness of the thick gate insulating layer 131 ranges from 35 to 50 nm. During such a wet etching process, the thick gate insulating layer 131 formed under the gate electrode does not change in thickness, because the thick gate insulating layer 131 is protected by the gate electrode from penetration of the DHF solution. Thus, the buffer insulating layer 131R disposed outside the gate electrode 151 has a thinner thickness than the thick gate insulating layer 131 under the gate electrode 151. In examples, it is preferable that the thickness of the buffer insulating layer 131R disposed outside the gate electrode ranges from 10 to 50% of the thickness of the thick gate insulating layer 131 directly under the gate electrode.

FIG. 14A and FIG. 14B illustrate a Scanning Electron Microscope (SEM) image of an LDMOS transistor (HV TR), which is a high voltage transistor, and a low voltage transistor (LV TR) after the first wet cleaning and second wet etching processes, respectively. Regardless of other aspects of the HV TR and the LV TR, these transistors have an undercut structure located near the edge of the gate electrode due to the wet etching process. The undercut structure is generated due the features corresponding to the isotropic etching of the wet etching. During such a wet etching process, oxide etching occurs on the exposed top surface of the thick gate insulating layer 131. Furthermore, a side surface of the thick gate insulating layer 131 near the edge of the first gate electrode 151 is exposed during the wet etching. Therefore, as illustrated in the SEM image of FIG. 14B, an undercut shape is also observed in the thin gate insulating layer 132 near the edge of the gate electrode 152. As the thickness is thinner, the thickness shows a smaller undercut shape.

Figure 15B:
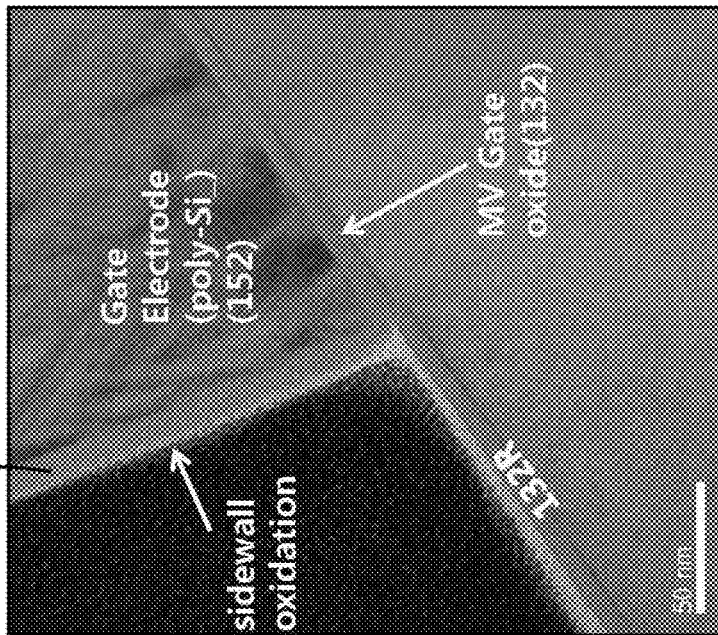
FIGS. 15A and 15B are diagrams illustrating a TEM cross-sectional view of a LDMOS transistor and a logic (or low voltage) transistor after forming a sidewall oxide layer.
Figure 15A:
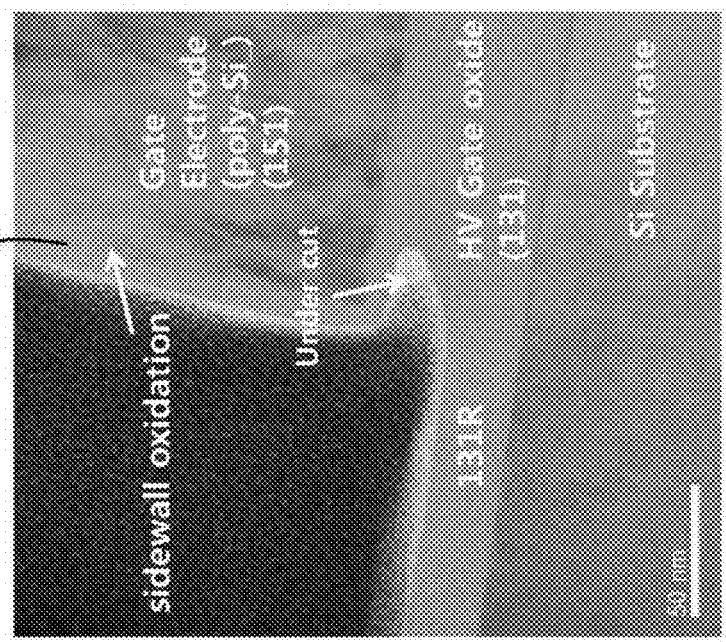

FIGS. 15A-15B are TEM images illustrating a gate electrode after a wet etching process followed by a sidewall thermal oxidation or light oxidation process. For example, the sidewall oxidation process may cure an etch damage caused by dry etching of the gate electrode. As illustrated in the TEM image of FIG. 15A, a first sidewall oxide layer 131S is grown on the sidewall of the gate by a sidewall thermal oxidation process. The growth of oxide layer over the substrate rather than the sidewall of the gate electrode is small, because a buffer insulating layer remains on the substrate. The sidewall oxidation process is conducted before the LDD formation. For example, the undercut structure at the edge of the gate insulating layer 131 is reduced performing by the thermal sidewall oxidation process. However, the undercut structure is not completely removed by only performing the sidewall oxidation process.

As illustrated in the TEM image of the example of FIG. 15B, a second sidewall oxide layer 132S is also formed on the gate sidewall during the thermal sidewall oxidation. Further, the example of FIG. 15B shows that the undercut of the thin gate insulating layer 132 is almost entirely removed. This feature is achieved because the thickness of the thin gate insulating layer is very small. As aforementioned, the thin gate insulating layer 132 is grown by a thermal oxidation process.

In an example, the thickness of the thick gate insulating layer 131 formed under the gate electrode in the high voltage MOSFET 810 is thicker than the thickness of the first buffer insulating layer 131R disposed outside the gate electrode. By contrast, as illustrated in a TEM image of the example of FIG. 15B, the second buffer insulating layer 132R is similar to the thickness of the thin gate insulating layer 132 under the gate electrode. It is to be noted that the thickness of the first buffer insulating layer 131R is thicker than that of the thin gate insulating layer 132 or the second buffer insulating layer 132R.

Figure 16:
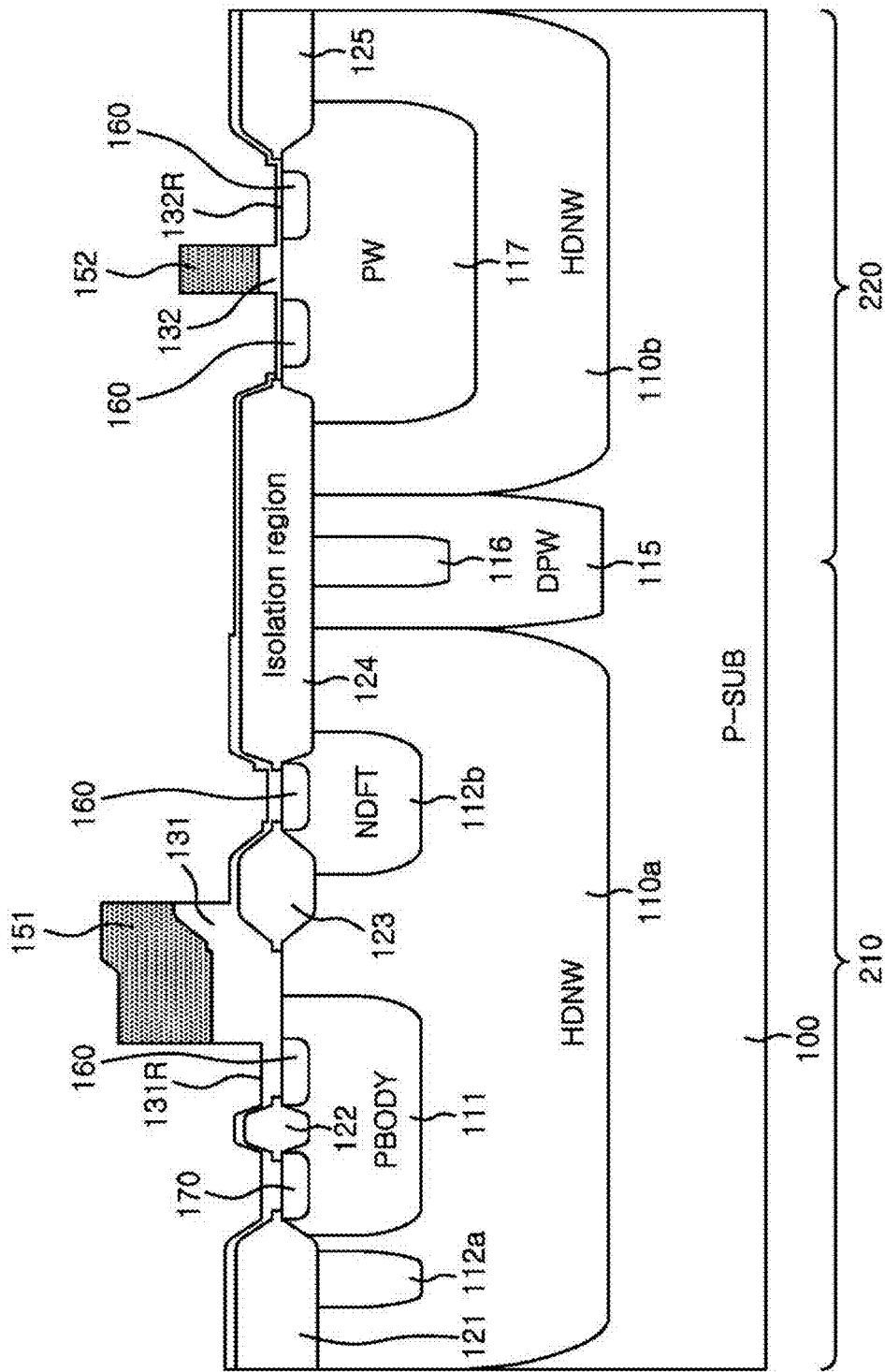
FIG. 16 is a diagram illustrating forming a low concentration LDD region of a first conductivity type and a second conductivity type.

FIG. 16 shows forming a first LDD region of a first conductivity type 160 and a second LDD region of a second conductivity type 170. In the example of FIG. 16, the first LDD region of a first conductivity type 160 is formed in a body region 111 and a drift region 112b. In such an example, the LDD region has an effect of reducing an electric field in the drain region. LDD implantation is performed through the first buffer insulating layer 131R and the second buffer insulating layer 132R. There is no difficulty in ion injecting to form such an LDD region because the first buffer insulating layer 131R is controlled to be less than 15 nm. The LDD region of a first conductivity type 160 has a lower doping concentration than that of the source region 161 and a drain region 163. For example, the second LDD region 170 is formed in a body region of a second conductivity type 111. Like the N-type LDD region 160, when the thickness of the first buffer insulating layer is less than 15 nm, the ion injecting energy for forming a P-type LDD region 170 may be 10-50 KeV.

Figure 17:
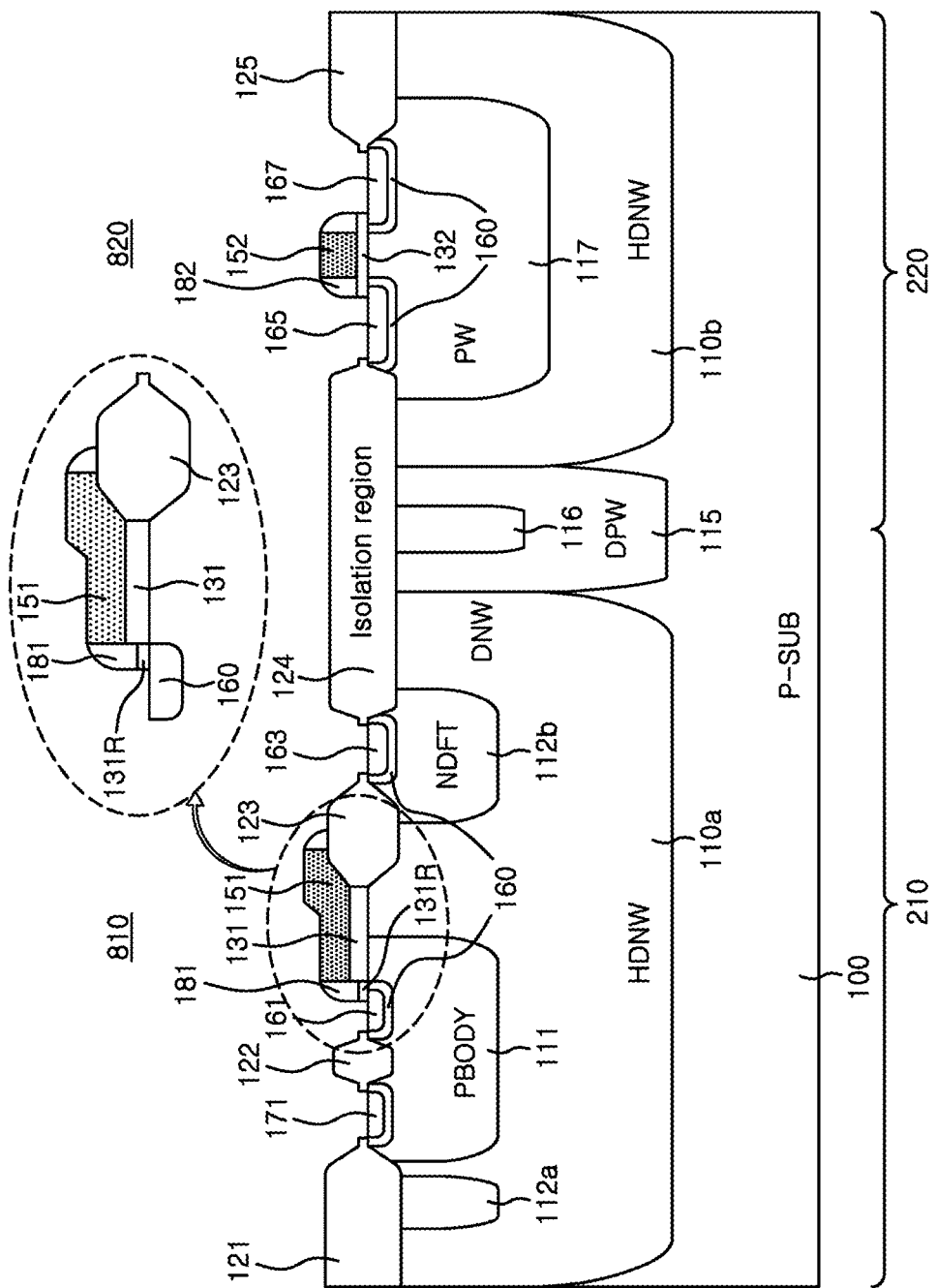
FIG. 17 is a diagram illustrating forming a high concentration source region and a drain region and a body contact region, after forming a spacer.
Figure 18:
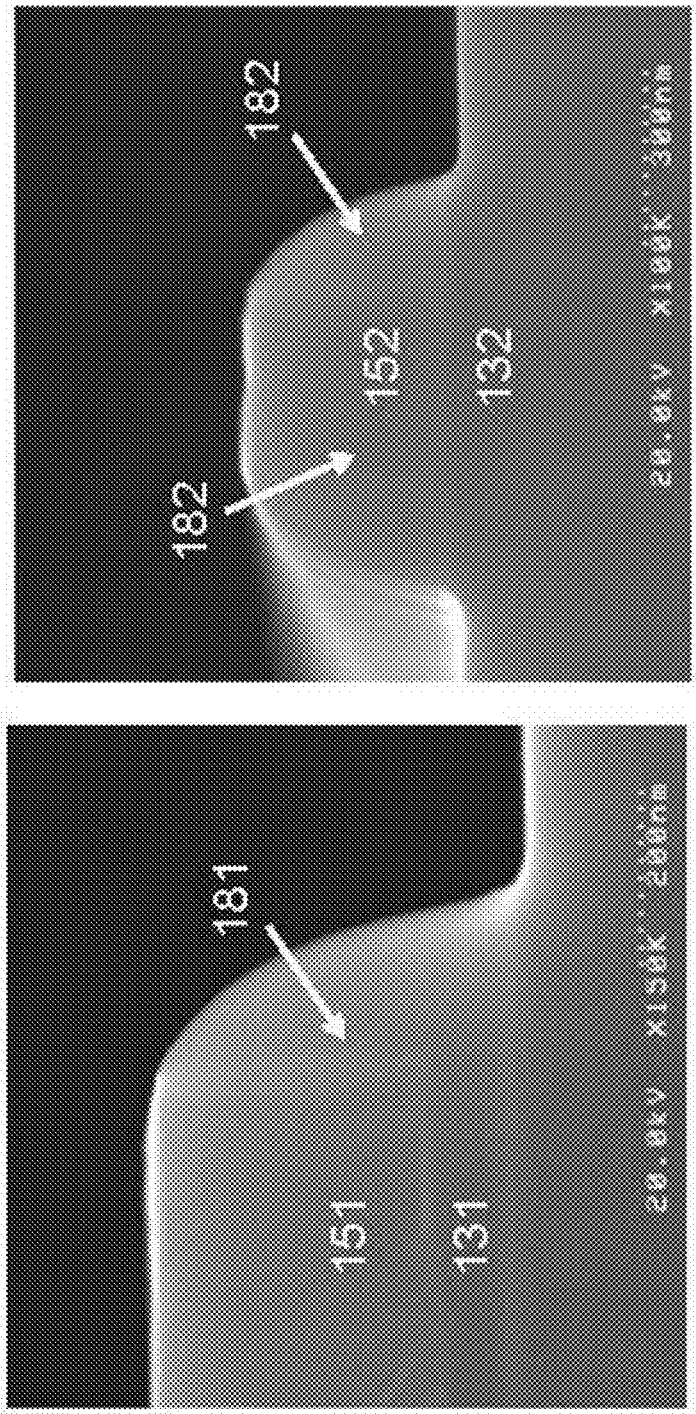
FIGS. 18A and 18B are diagrams illustrating a SEM cross sectional view of a LDMOS transistor and a logic or low voltage transistor, after forming a spacer.

FIG. 17 is a diagram illustrating forming a spacer and a high concentration source and drain, after forming the LDD region. After forming the LDD regions 160 and 170, the spacers 181 and 182 are formed on the gate sidewall. For example, according to the example of FIG. 17, the spacers 181 and 182 are formed on the side surface of the gate electrode by disposing a spacer insulating layer and etching the insulating layer through an etch-back process. Referring to the enlarged image of FIG. 17, the first buffer insulating layer 131R still remains below the first spacer 181. The remaining thickness of the gate insulating layer under the sidewall spacers depends on aspects of the wet etching process. According to the present application, it is preferable that the thickness of the first buffer insulating layer 131R below the sidewall spacer 181 remains as 10-50% of the thickness of the thick gate insulating layer 131 under the gate electrode 151.

Additionally, an ion injecting process is conducted to form source regions 161 and 165 and drain regions 163 and 167 in the substrate. The source region 161 and the drain region 163 of the first region 210 and the source region 165 and the drain region 167 of the second region 220 are simultaneously formed in the same step, and thereby the depth of these regions are the same. Furthermore, a high concentration body contact region 171 is formed in the P-type body region. Subsequently, a silicide process is conducted that simultaneously forms a silicide on the substrate 100 surface and the gate electrode surface.

FIG. 18A and FIG. 18B are SEM cross-sectional views of a LDMOS transistor and a low voltage transistor after forming spacers 181 and 182. According to these examples, the undercut near the thick gate insulating layer 131 and the thin gate insulating layer 132 disappears after spacers 181 and 182 are formed. Removing the undercut occurs because the undercut is filled by CVD oxide layer. If the undercut still remained, it would be difficult to control the leakage current and threshold voltage.

Figure 19:
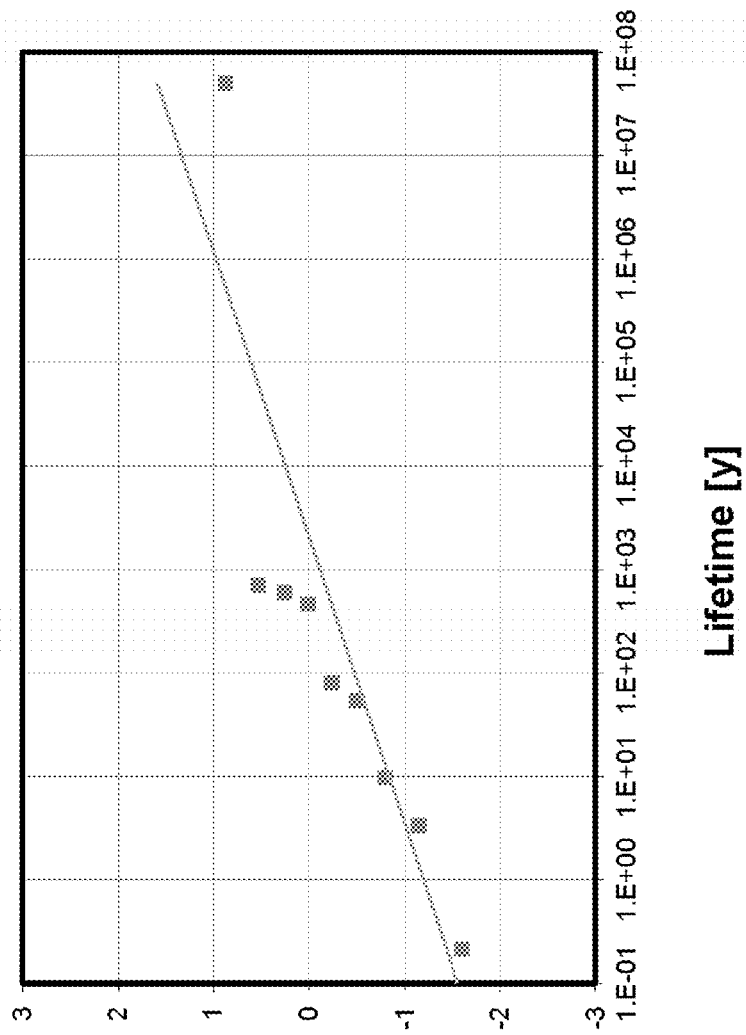
FIG. 19 is a diagram illustrating reliability of a LDMOS transistor.

FIG. 19 is a diagram of NMOS hot carrier injection (HCI) result of 20V high voltage MOSFET 810, according to an example. FIG. 19 shows a high reliability as it shows a lifetime of 199 years. In particular, FIG. 19 shows Weibull distribution data corresponding to lifetime in years. Accordingly, a device shows high reliability if the thickness of the insulating layer disposed under the sidewall spacer is 10-50% of the thick gate insulating layer under the gate electrode. In such an example, the thickness of the insulating layer formed below the spacer is less than half of the thickness, i.e., 10-50%, of the gate insulating layer below the gate electrode.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
a gate insulating layer formed on a substrate;
a gate electrode formed on the gate insulating layer;
a lightly doped first doping region formed in the substrate;
a lightly doped second doping region formed in the substrate and having a depth deeper than a depth of the lightly doped first doping region;
first and second spacers, respectively formed on sidewalls of the gate electrode, wherein the first spacer overlaps with the lightly doped first doping region, and the second spacer overlaps with the lightly doped second doping region; and
a source region and a drain region formed in the substrate, wherein the drain region is surrounded by the lightly doped second doping region,
wherein the gate insulating layer has a first part, having a first thickness, under the gate electrode and has a second part, having a second thickness less than the first thickness, under the first or second spacer.

2. The semiconductor device of claim 1, wherein the source region or the drain region overlaps with the second part of the gate insulating layer having the second thickness.

3. The semiconductor device of claim 1, wherein the lightly doped second doping region overlaps with both the first part of the gate insulating layer having the first thickness and the second part of the gate insulating layer having the second thickness.

4. The semiconductor device of claim 1, wherein the lightly doped second doping region has a depth greater than a depth of the source region.

5. The semiconductor device of claim 1, wherein the gate insulating layer has a thickness under the first spacer and has a same thickness under the second spacer.

6. The semiconductor device of claim 1, wherein a top surface of the gate insulating layer formed under the gate electrode has a higher position than a bottom surface of the first spacer or a bottom surface of the second spacer.

7. The semiconductor device of claim 1, wherein the lightly doped first doping region has a depth less than a depth of each of the source region and the drain region.

8. The semiconductor device of claim 1, wherein the second thickness is 10% to 50% of the first thickness.

9. A manufacturing method of a semiconductor device, the method comprising:
forming a gate insulating layer on a substrate;
forming a gate electrode on the gate insulating layer;
forming a lightly doped first doping region in the substrate;
forming a lightly doped second doping region in the substrate and having a depth deeper than a depth of the lightly doped first doping region;
forming first and second spacers respectively on sidewalls of the gate electrode, wherein the first spacer overlaps with the lightly doped first doping region, and the second spacer is overlaps with the lightly doped second doping region; and
forming a source region and a drain region in the substrate, wherein the drain region is surrounded by the lightly doped second doping region,
wherein the gate insulating layer has a first part, having a first thickness, under the gate electrode and a has a second part, having second thickness less than the first thickness, under the first or second spacer.

10. The method of claim 9, wherein the lightly doped second doping region has a depth greater than a depth of the source region.

11. The method of claim 9, wherein the forming the lightly doped second doping region in the substrate occurs after forming the gate electrode.

12. The method of claim 9, wherein the gate insulating layer under the first spacer has a same thickness as a thickness under the second spacer.

13. The method of claim 9, wherein a top surface of the gate insulating layer formed under the gate electrode has a higher position than a bottom surface of the first spacer or a bottom surface of the second spacer.

14. The method of claim 9, wherein the second thickness is 10% to 50% of the first thickness.

15. A semiconductor device, comprising:
a gate insulating layer formed on a substrate;
a gate electrode formed on the gate insulating layer;
a source region and a drain region formed in the substrate;
first and second spacers, respectively formed on sidewalls of the gate electrode, wherein the first spacer overlaps with the source region, and the second spacer overlaps with the drain region;
a lightly doped first doping region overlapped with the first spacer; and
a lightly doped second doping region overlapped with the second spacer, and
wherein a top surface of the gate insulating layer formed under the gate electrode has a higher position than a bottom surface of the first spacer or a bottom surface of the second spacer.

16. The semiconductor device of claim 15, wherein the gate insulating layer has a first part, having a first thickness, under the gate electrode and has a second part, having a second thickness less than the first thickness, under the first or second spacer.

17. The semiconductor device of claim 16, wherein the second thickness is 10% to 50% of the first thickness.

18. The semiconductor device of claim 15, wherein the lightly doped second doping region has a depth deeper than a depth of the lightly doped first doping region, wherein the drain region is surrounded by the lightly doped second doping region.

* * * * *